(12) United States Patent
Gou et al.

(10) Patent No.: US 12,658,617 B2
(45) Date of Patent: Jun. 16, 2026

(54) CONNECTOR, FRAME DEVICE, AND CONNECTOR ASSEMBLY METHOD

(71) Applicant: HUAWEI TECHNOLOGIES CO., LTD., Shenzhen (CN)

(72) Inventors: Weicheng Gou, Dongguan (CN); Jinhua Ye, Dongguan (CN); Chongyang Wang, Shenzhen (CN); Daochun Mo, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 329 days.

(21) Appl. No.: 18/462,427

(22) Filed: Sep. 7, 2023

(65) Prior Publication Data

US 2023/0411881 A1 Dec. 21, 2023

Related U.S. Application Data

(63) Continuation of application No. PCT/CN2022/073857, filed on Jan. 25, 2022.

(30) Foreign Application Priority Data

| Mar. 12, 2021 | (CN) | .......................... 202110268374.1 |
| Apr. 30, 2021 | (CN) | .......................... 202110484934.7 |

(51) Int. Cl.
*H01R 12/71* (2011.01)
*H01R 12/58* (2011.01)
(Continued)

(52) U.S. Cl.
CPC ........... *H01R 12/716* (2013.01); *H01R 12/58* (2013.01); *H01R 13/6594* (2013.01); *H05K 5/0247* (2013.01)

(58) Field of Classification Search
CPC .. H01R 12/73; H01R 12/716; H01R 13/6587; H01R 12/58; H01R 12/735; H01R 13/6594; H01R 13/514; H05K 5/0247
(Continued)

(56) References Cited

U.S. PATENT DOCUMENTS

| 5,703,760 A | 12/1997 | Zhu |
| 7,297,031 B2 | 11/2007 | Leddy |
| (Continued) | | |

FOREIGN PATENT DOCUMENTS

| CN | 105375143 A | 3/2016 |
| CN | 210868472 U | 6/2020 |
| (Continued) | | |

*Primary Examiner* — Abdullah A Riyami
*Assistant Examiner* — Amara Anderson

(57) ABSTRACT

A connector, a frame device, and a connector assembly method. Some terminal modules in the connector provided in the present disclosure are removed, or some terminal pairs in the terminal module are removed, so that a quantity of terminal pairs included in the connector is reduced without changing an outline dimension of the connector, thereby ensuring an original docking capability of the connector. In addition, a serial connector may be formed based on different quantities of removed terminal modules or removed terminal pairs. In this way, in the frame device, a user may select a connector of a corresponding specification based on an actual specification of a board, instead of selecting connectors of a high specification uniformly.

16 Claims, 22 Drawing Sheets

(51) Int. Cl.
 *H01R 13/6594* (2011.01)
 *H05K 5/02* (2006.01)
(58) Field of Classification Search
 USPC .......................................................... 439/74
 See application file for complete search history.

(56) References Cited

U.S. PATENT DOCUMENTS

| | | | |
|---|---|---|---|
| 7,824,187 B1 | 11/2010 | Yi | |
| 2008/0146053 A1 | 6/2008 | Minich | |
| 2014/0242841 A1* | 8/2014 | Trout ................. | H01R 13/6585 |
| | | | 439/607.55 |
| 2020/0266583 A1* | 8/2020 | Laurx .................. | H01R 12/737 |
| 2020/0381872 A1 | 12/2020 | Laurx et al. | |

FOREIGN PATENT DOCUMENTS

| | | | |
|---|---|---|---|
| JP | 2003125518 A | 4/2003 |
| JP | 2004139745 A | 5/2004 |
| JP | 2008293950 A | 12/2008 |
| JP | 2014165175 A | 9/2014 |
| JP | 2016110837 A | 6/2016 |
| JP | 2018536255 A | 12/2018 |
| WO | 2007076900 A1 | 7/2007 |

* cited by examiner

CONNECTOR, FRAME DEVICE, AND CONNECTOR ASSEMBLY METHOD

CROSS-REFERENCE TO RELATED APPLICATIONS

This application is a continuation of International Application No PCT/CN2022/073857, filed on Jan. 25, 2022, which claims priority to Chinese Patent Application No. 202110268374.1, filed on Mar. 12, 2021 and Chinese Patent Application No. 202110484934.7, filed on Apr. 30, 2021. All of the aforementioned patent applications are hereby incorporated by reference in their entireties.

TECHNICAL FIELD

The present disclosure relates to the field of communication technologies, and in particular, to a connector, a frame device, and a connector assembly method.

BACKGROUND

Orthogonal direct (OD) is usually used in a frame device. Orthogonal direct means that, after a line card board and a switch fabric unit are connected through a connector, a plane on which the line card board is located is vertical to a plane on which the switch fabric unit is located. Specifically, a first connector is disposed on the switch fabric unit, a second connector is disposed on the line card board, and the first connector is docked with the second connector. Orthogonal direct can control a minimum length of cabling between the line card and the switch fabric unit.

A frame device in a related technology generally includes a plurality of switch fabric units and a plurality of line card boards, and specifications of the plurality of switch fabric units are the same. Therefore, specifications of first connectors disposed on the plurality of switch fabric units are also the same. In addition, to adapt to the plurality of first connectors of the same specification, regardless of specifications of the line card boards are high or low, specifications of a plurality of second connectors disposed on the plurality of line card boards are also the same.

However, line card boards of different specifications require different quantities of terminal pairs, and connectors of a same specification include a same quantity of terminal pairs. Therefore, terminal pairs in a second connector disposed on a line card board of a low specification are not all used, and some terminal pairs are in an idle state. This undoubtedly causes waste of terminal pairs and increases costs of the frame device.

SUMMARY

The present disclosure provides a connector, a frame device, and a connector assembly method, and can reduce waste of terminal pairs in a connector and reduce costs of the frame device. The technical solutions of the connector, the frame device, and the connector assembly method are described below.

According to a first aspect, a connector is provided. The connector includes a first housing and at least one first terminal module. The first terminal module is configured to transmit an electrical signal. The at least one first terminal module is arranged in a thickness direction. The at least one first terminal module is fastened in the first housing, and the first housing has a vacancy.

The first terminal module is configured to transmit an electrical signal, where the first terminal module may also be referred to as a wafer.

A position of the vacancy is not limited in the present disclosure. The vacancy may be located between two first terminal modules, or may be located between the first terminal module and an inner wall of the first housing. A dimension of a vacancy in the thickness direction of the first terminal module may be equal to a thickness of the first terminal module, and a plurality of vacancies may be separated from each other, or may be connected to form a large vacancy.

The connector provided in the present disclosure may be referred to as an N/M serial connector. M is a maximum quantity of first terminal modules that can be accommodated in the first housing, N is an actual quantity of first terminal modules accommodated in the first housing, and N is less than M.

According to the solution shown in the present disclosure, some first terminal modules in the connector are removed to form the N/M serial connector, so that a quantity of terminal pairs included in the N/M serial connector is reduced, and costs are reduced. In addition, only some first terminal modules are removed, so that an outline dimension of the N/M serial connector remains unchanged, and it is ensured that, compared with a connector from which the first terminal modules are not removed, a docking capability of the N/M serial connector 1 with a peer connector remains unchanged.

In addition, based on different quantities of the first terminal modules actually accommodated in the first housing, a plurality of types of N/M serial connectors may be formed, and the plurality of types of N/M serial connectors include different quantities of the terminal pairs (that is, different specifications), but can all be connected to a same connector.

In this way, in a frame device, a user may select an N/M serial connector of a corresponding specification based on an actual specification of a line card board, instead of selecting connectors of a same specification uniformly, so that waste of terminal pairs and costs of the frame device are reduced. In addition, the user can select an N/M serial connector of a corresponding specification based on an actual specification of a switch fabric unit to form a series of frame devices of different specifications. In addition, these series of frame devices of different specifications have N/M serial connectors with the same docking capability, and therefore can support mixed use of line card boards.

In a possible implementation, the connector further includes at least one placeholder module. The at least one placeholder module and the at least one first terminal module are arranged in the thickness direction. The at least one placeholder module is fastened in the first housing and occupies a vacancy in the first housing.

The placeholder module does not include a terminal pair configured to transmit an electrical signal.

According to the solution shown in the present disclosure, the placeholder module is used for placeholder the vacancy in the first housing, so that an overall structure of the N/M serial connector is more stable.

In a possible implementation, the placeholder module is a support member that can support a terminal pair. The placeholder module includes at least one terminal accommodating structure, and the at least one terminal accommodating structure is vacant.

According to the solution shown in the present disclosure, the support member that can support the terminal pair is used as the placeholder module, so that no additional production line needs to be disposed to produce the placeholder module, thereby reducing production costs of the placeholder module.

In addition, the support member that can support the terminal pair is used as the placeholder module, so that the placeholder module and the first terminal module are well matched, and the placeholder module and the first housing are well matched. In this way, the N/M serial connector has relatively good structural stability, and has relatively good docking capability with the peer connector.

In a possible implementation, the first terminal module includes a first support member and at least one first terminal pair. The at least one first terminal pair is fastened on the first support member. The placeholder module is the same as the first support member.

In a possible implementation, the first terminal module includes a first support member and at least one first terminal pair. The first support member includes at least one first terminal accommodating structure, and the at least one first terminal pair is respectively fastened in the at least one first terminal accommodating structure. Both the terminal accommodating structure in the placeholder module and the first terminal accommodating structure in the first support member are both arranged in a first direction, and the terminal accommodating structure and the first terminal accommodating structure are alternated one after another in the first direction.

In a possible implementation, the placeholder module is a placeholder plate, and the placeholder module has a plate structure.

In a possible implementation, a thickness of the first terminal module is equal to a thickness of the placeholder module.

According to the solution shown in the present disclosure, the placeholder module and the first terminal module are disposed to have an equal thickness, so that the placeholder module can better occupy a vacancy in the first housing, and the connector is more stable. In addition, regardless of how a position and quantity of placeholder module change (while M remains unchanged), it can be ensured that a position of the remaining first terminal module in the first housing does not deviate, and it is ensured that, compared with a connector from which the first terminal module is not removed, a docking capability of the N/M serial connector remains unchanged.

In a possible implementation, a ratio of a quantity of first terminal modules to a quantity of placeholder modules is 1:1.

In a possible implementation, the at least one first terminal module is consecutively arranged, and the at least one placeholder module is consecutively arranged.

In a possible implementation, the first terminal module and the placeholder module are alternately arranged.

According to a second aspect, another connector is provided. The connector includes a second housing and a plurality of second terminal modules. The plurality of second terminal modules are arranged in a thickness direction and are fastened in the second housing. The second terminal module includes a second support member and at least one second terminal pair. The second support member includes a plurality of second terminal accommodating structures, each second terminal pair is fastened in one second terminal accommodating structure, and at least one second terminal accommodating structure is vacant.

The second terminal module may also be referred to as a wafer.

The second support member is a structural member supporting the second terminal pair, and includes a plurality of second terminal accommodating structures. The second terminal pair is configured to transmit an electrical signal, and may be a ground terminal pair, a signal terminal pair, or a signal terminal and a ground terminal. This is not limited in the present disclosure.

The connector provided in the present disclosure may be referred to as a Y/X serial connector. X is a quantity of second terminal accommodating structures, Y is a quantity of second terminal pairs, and Y is less than X.

According to the solution shown in the present disclosure, some second terminal pairs in the connector are removed to form the Y/X serial connector, so that a quantity of second terminal pairs included in the Y/X serial connector is reduced, and costs are reduced. In addition, only some second terminal pairs are removed, and an outline dimension of the Y/X serial connector remains unchanged, so that docking capability of the Y/X serial connector remains unchanged.

In addition, a series of a plurality of types of Y/X serial connectors may be formed based on different quantities of the vacant second terminal accommodating structures in the Y/X serial connectors, and the plurality of types of Y/X serial connectors include different quantities of the terminal pairs (that is, different specifications), but can all dock with a same connector.

In this way, in a frame device, a user may select a Y/X serial connector of a corresponding specification based on an actual specification of a line card board, instead of selecting connectors of a same specification uniformly, so that waste of terminal pairs and costs of the frame device are reduced. In addition, the user can select a Y/X serial connector of a corresponding specification based on an actual specification of a switch fabric unit to form a series of frame devices of different specifications. In addition, these series of frame devices of different specifications have Y/X serial connectors with the same docking capability, and therefore can support mixed use of line card boards.

In a possible implementation, a ratio of a quantity of second terminal accommodating structures that are in the second support member and in which the second terminal pair is fastened to a quantity of vacant second terminal accommodating structures in the second support member is 1:1.

In a possible implementation, the second terminal accommodating structures in which the second terminal pair is fastened are consecutively arranged, and the vacant second terminal accommodating structures in the second support member are consecutively arranged in the second support member.

In a possible implementation, the second terminal accommodating structures that are in the second support member and in which the second terminal pair is fastened and the vacant second terminal accommodating structures in the second support member are alternately arranged.

In a possible implementation, the plurality of second terminal accommodating structures that are in the second support member and in which the second terminal pair is fastened are arranged in a same manner as the vacant second terminal accommodating structures in the second support member.

According to a third aspect, a frame device is provided. The frame device includes a first board, a second board, a first connector, and a second connector. At least one of the first connector and the second connector is the connector according to the first aspect or the second aspect. The first board is electrically connected to a first end of the first connector. The second board is electrically connected to a first end of the second connector. A second end of the first connector is electrically connected to a second end of the second connector.

One of the first connector and the second connector is a male connector (for example, a curved male connector), and the other is a female connector (for example, a curved female connector).

According to the solution shown in the present disclosure, the connector provided in the present disclosure is applied to the frame device, so that a quantity of terminal pairs in an idle state is reduced, and waste of terminal pairs is reduced, thereby reducing costs of the frame device.

In a possible implementation, the first board is a switch fabric unit, the second board is a line card board, and the second connector is the connector according to the first aspect or the second aspect.

In a possible implementation, one of the first connector and the second connector is the connector according to the first aspect, and the other is the connector according to the second aspect.

In a possible implementation, the first connector is the connector according to the first aspect, the second connector is the connector according to the second aspect, and a position of the vacant second terminal accommodating structure of the second connector corresponds to a position of the vacancy of the first connector.

In a possible implementation, the first connector is the connector according to the second aspect, the second connector is the connector according to the first aspect, and a position of the vacancy of the second connector corresponds to a position of the second terminal accommodating structure of the first connector.

According to a fourth aspect, a connector assembly method is provided. The method includes: arranging at least one first terminal module in a thickness direction, and fastening the at least one first terminal module in a first housing.

The first terminal module is configured to transmit an electrical signal, where the first housing in which the at least one first terminal module is fastened has a vacancy.

In a possible implementation, the arranging at least one first terminal module in a thickness direction, and fastening the at least one first terminal module in a first housing includes: arranging the at least one first terminal module and at least one placeholder module in the thickness direction and fastening the at least one first terminal module and the at least one placeholder module in the first housing.

The placeholder module occupies the vacancy in the first housing.

According to a fifth aspect, another connector assembly method is provided. The method includes: fastening a second terminal pair in each of some second terminal accommodating structures of a second support member, to form a second terminal module; and arranging a plurality of second terminal modules in a thickness direction and fastening the plurality of second terminal modules in a second housing.

Figure 1:
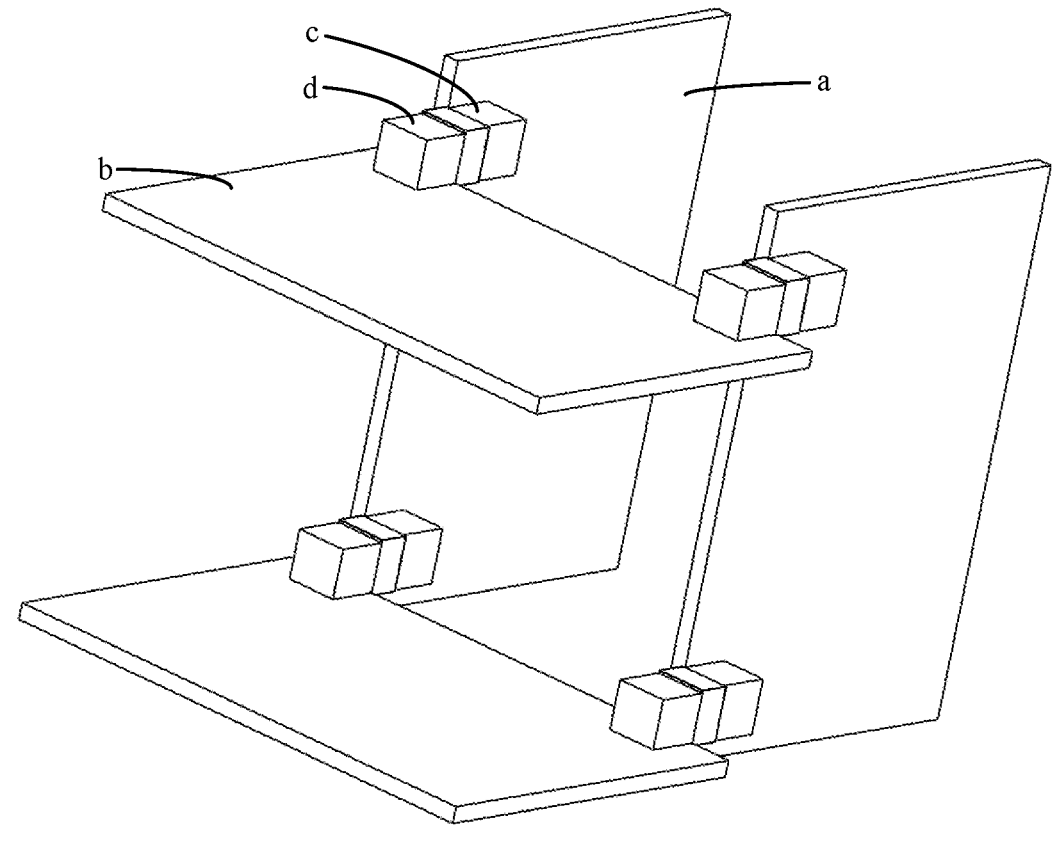
FIG. 1 is a diagram of an architecture of a frame device according to an embodiment of the present disclosure.

DESCRIPTION OF REFERENCE NUMERALS a: first board, b: second board, c: first connector, and d: second connector;

1. N/M serial connector;

10 first housing, 100: vacancy, 101: first front housing, 102: first bottom plate, 1020: first terminal hole, 103: first right side clamping plate, 104: first left side clamping plate, and 105: first reinforcing plate;

11: first terminal module, 111: first support member, 1110: first terminal accommodating structure, 1111: first fastening plate, 1112: first shielding piece, 1113: second shielding piece, and 112: first terminal pair;

12: placeholder module, 120: terminal accommodating structure, 121: placeholder fastening plate, 122: third shielding piece, and 123: fourth shielding piece;

2: Y/X serial connector;

20 second housing, 201: second front housing, 202: second bottom plate, 2020: second terminal hole, 203: second right side clamping plate, 204: second left side clamping plate, and 205: second reinforcing plate; and

21: second terminal module, 211: second support member, 2110: second terminal accommodating structure, 2111: second fastening plate, 2112: fifth shielding piece, 2113: sixth shielding piece, and 212: second terminal pair.

DETAILED DESCRIPTION

To facilitate description of the technical solutions recorded in embodiments of the present disclosure, the following first describes several concepts related to embodiments of the present disclosure.

A specification of a board (a switch fabric unit or a line card board) represents a forwarding capacity of the board and is related to a type and quantity of chips on the board.

A specification of a connector represents a quantity of terminal pairs included in the connector. A connector of a higher specification includes more terminal pairs, and a total rate of transmitting a signal is also higher. Generally, a connector of a higher specification has a larger outline dimension. Therefore, a male connector and a female connector in a related technology can be smoothly docked only when specifications are the same.

A board of a higher specification requires a connector of a higher specification. When the specification of the board adapts to the specification of the connector disposed on the board, all terminal pairs in the connector are used and no terminal pair is idle. When the specification of the board is relatively small, but the specification of the connector disposed on the board is relatively large, some terminal pairs in the connector are used, and the other terminal pairs are idle.

An orthogonal architecture (orthogonal direct, OD) is a system interconnection architecture in a frame device. In the orthogonal architecture, the line card board and the switch fabric unit are perpendicular to each other, and are directly connected through connectors. The orthogonal architecture greatly shortens a cabling length between the line card board and the switch fabric unit. The line card board may also be referred to as a line card, a service board, a line processing unit (LPU), or the like. The switch fabric unit may also be referred to as a switch card, a switch fabric element (FE), or the like.

FIG. 1 is a schematic diagram of a frame device with an orthogonal architecture. The frame device includes a first board a, a second board b, a first connector c, and a second connector d. The first board a is perpendicular to the second board b. The first connector c is disposed on the first board a, and is electrically connected to the first board a. The second connector d is disposed on the second board b, and is electrically connected to the second board b. The first connector c docks with the second connector d. The first board a may be a switch fabric unit. The second board b may be a line card board. One of the first connector c and the second connector d is a male connector (for example, a curved male connector), and the other is a female connector (for example, a curved female connector).

The frame device includes a plurality of switch fabric units and a plurality of line card boards. Specifications of the plurality of switch fabric units are the same. The plurality of line cards can be replaced, added, or deleted based on a selection of a user. Therefore, specifications of the plurality of line cards are not necessarily the same.

Because the specifications of the plurality of switch fabric units are the same, specifications of the first connectors c disposed on the switch fabric units are also the same. However, connectors of different specifications in a related technology cannot be smoothly docked due to reasons such as an outline dimension. Therefore, regardless of specifications of the plurality of line card boards, a second connector d of a same specification as the first connector c is disposed, to ensure that the first connector c and the second connector d can be smoothly docked.

However, some terminal pairs in the second connector d disposed on a line card board of a low specification are definitely in an idle state, and this undoubtedly causes waste of terminal pairs and increases costs of the frame device.

In view of this, an embodiment of the present disclosure provides a new connector, and the connector can resolve the foregoing technical problem.

Figure 2:
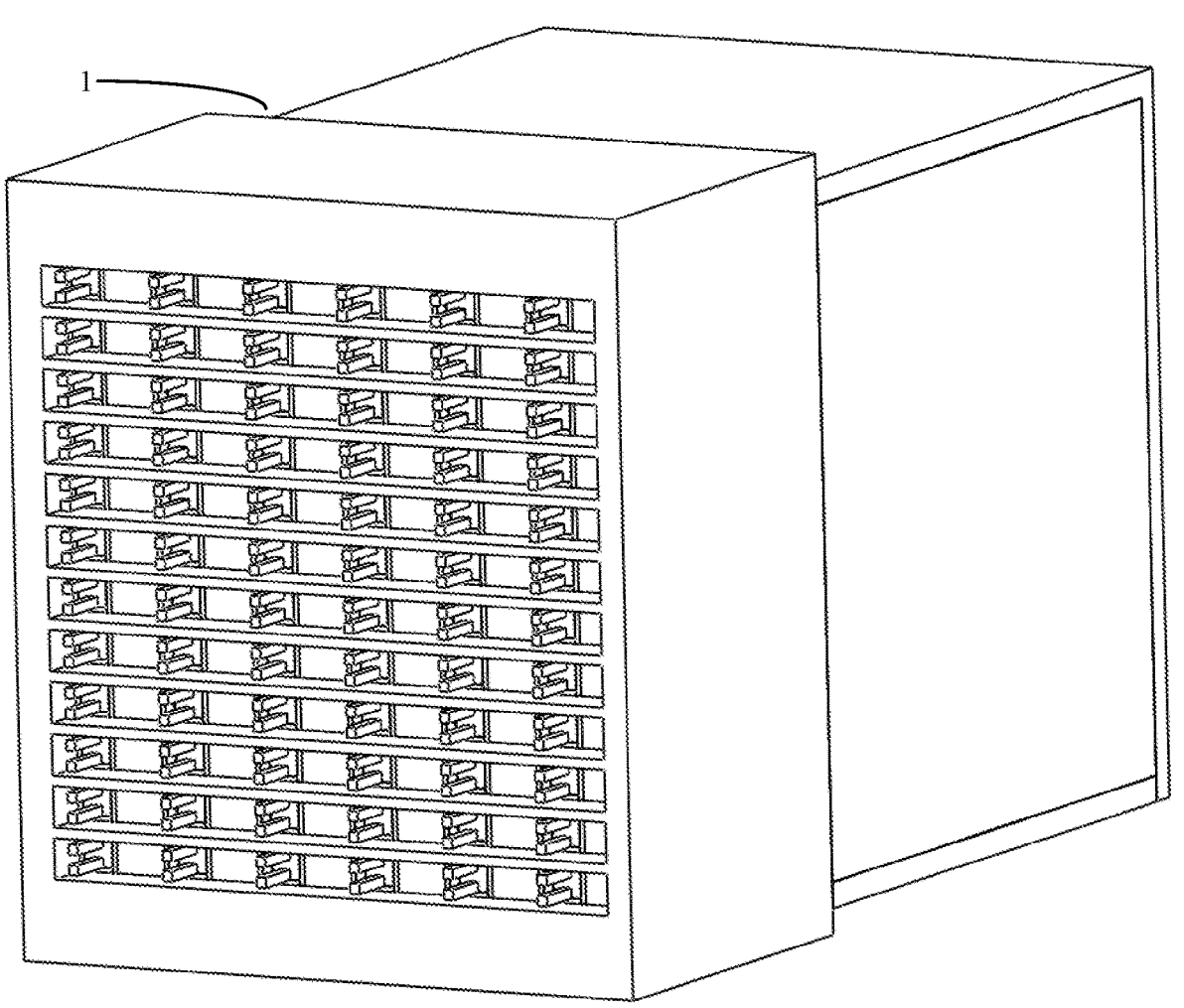
FIG. 2 is a schematic diagram of a connector according to an embodiment of the present disclosure.
Figure 3:
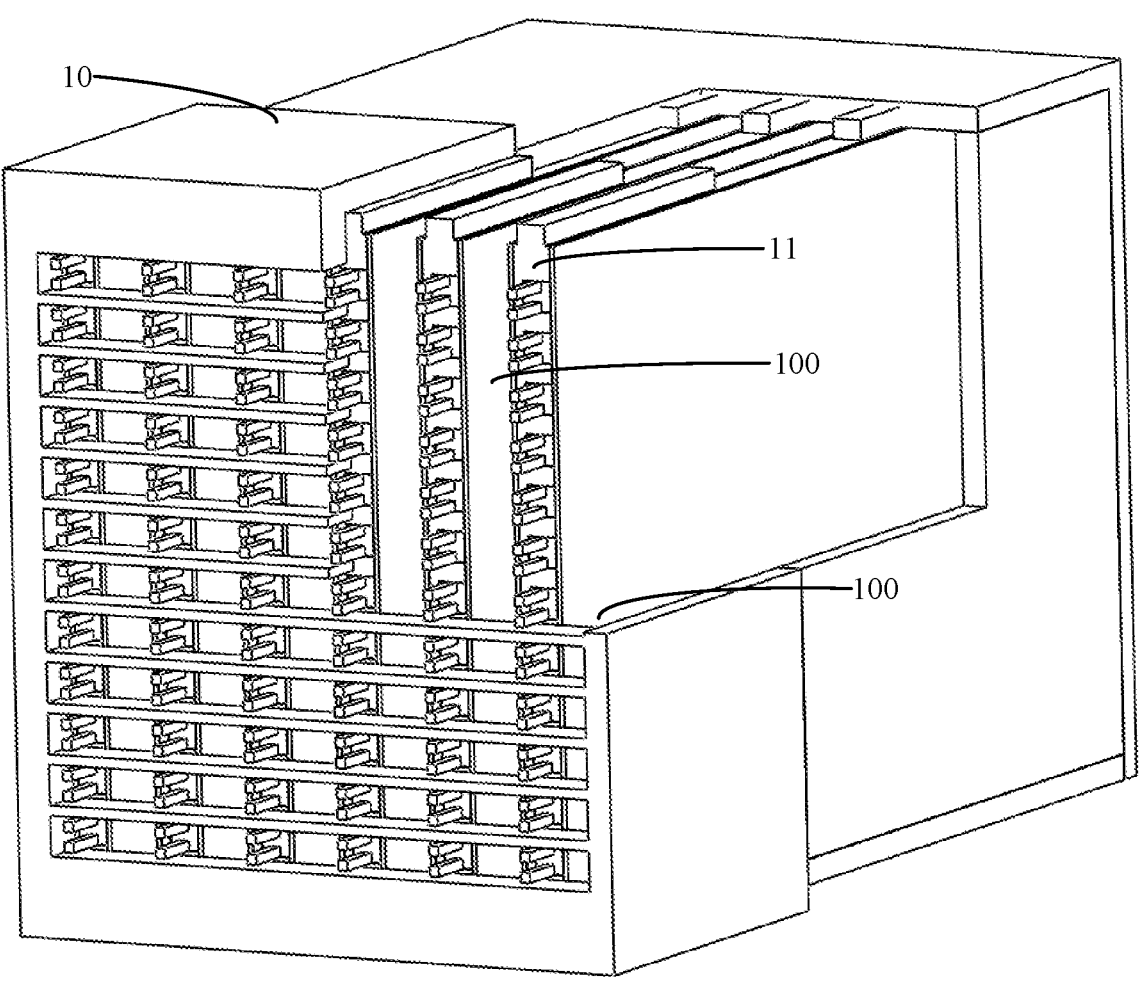
FIG. 3 is a sectional view of a connector according to an embodiment of the present disclosure.

An embodiment of the present disclosure provides a connector. As shown in FIG. 2 and FIG. 3, the connector includes a first housing 10 and at least one first terminal module 11. The at least one first terminal module 11 is arranged in a thickness direction. The at least one first terminal module 11 is fastened in the first housing 10, and the first housing 10 has a vacancy 100.

The first housing 10 is configured to accommodate the first terminal module 11.

The first terminal module 11 is configured to transmit an electrical signal, and the first terminal module 11 may also be referred to as a wafer.

A position of the vacancy 100 is not limited in this embodiment of the present disclosure. The vacancy 100 may be located between two first terminal modules 11, or may be located between the first terminal module 11 and an inner wall of the first housing 10. A dimension of the vacancy 100 in the thickness direction of the first terminal module 11 may be equal to a thickness of the first terminal module 11, and a plurality of vacancies 100 may be separated from each other, or may be connected to form a large vacancy.

The connector provided in this embodiment of the present disclosure may be referred to as an N/M serial connector 1. M is a maximum quantity of first terminal modules 11 that can be accommodated in the first housing 10, N is an actual quantity of first terminal modules 11 accommodated in the first housing 10, and N is less than M.

According to the solution shown in this embodiment of the present disclosure, some first terminal modules 11 in the connector are removed to form the N/M serial connector 1, so that a quantity of first terminal pairs 112 (the first terminal module 11 includes the first terminal pair 112) included in the N/M serial connector 1 is reduced, and costs are reduced. In addition, only some first terminal modules 11 are removed, so that an outline dimension of the N/M serial connector 1 remains unchanged, and it is ensured that, compared with a connector (which may be referred to as a full connector) from which the first terminal modules 11 are not removed, a docking capability of the N/M serial connector 1 with a peer connector remains unchanged. That is, compared with the full connector, the N/M serial connector 1 includes a different quantity of first terminal pairs 112 (that is, a specification is different), but can dock with the same peer connector.

In addition, based on different quantities of the first terminal modules 11 actually accommodated in the first housing 10, a series of a plurality of types of N/M serial connectors 1 may be formed. In addition, specifications of the plurality of types of N/M serial connectors 1 are different, but can all dock with the same peer connector.

In this way, in a frame device, a user may select an N/M serial connector 1 of a corresponding specification based on an actual specification of a line card board, instead of selecting connectors of a same high specification uniformly, so that waste of terminal pairs and costs of the frame device are reduced. In addition, the user can select an N/M serial connector 1 of a different specification based on an actual specification of a switch fabric unit to form a series of frame devices of different specifications. In addition, these series of frame devices of different specifications have N/M serial connectors 1 with the same docking capability, and therefore can support mixed use of line card boards.

Figure 4:
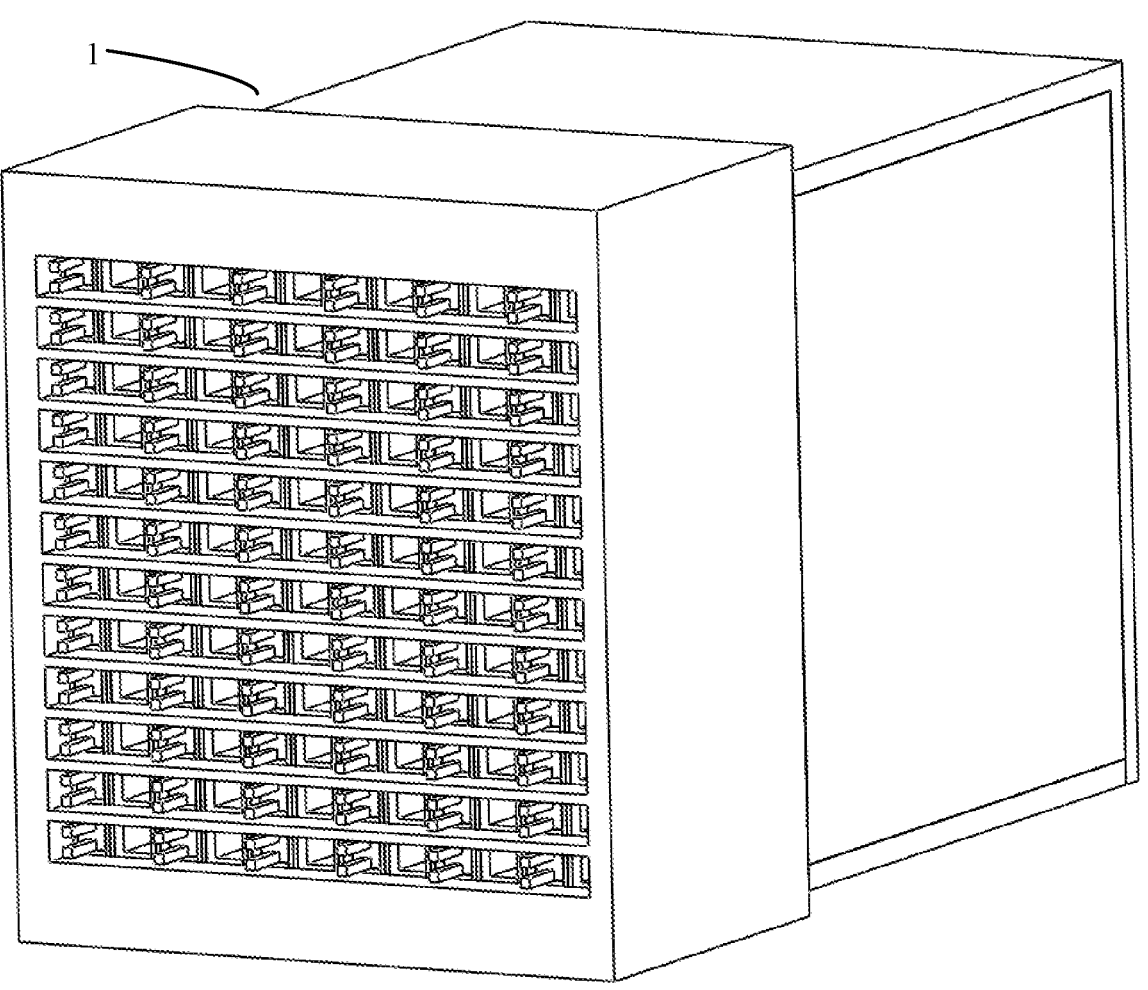
FIG. 4 is a schematic diagram of a connector according to an embodiment of the present disclosure.
Figure 5:
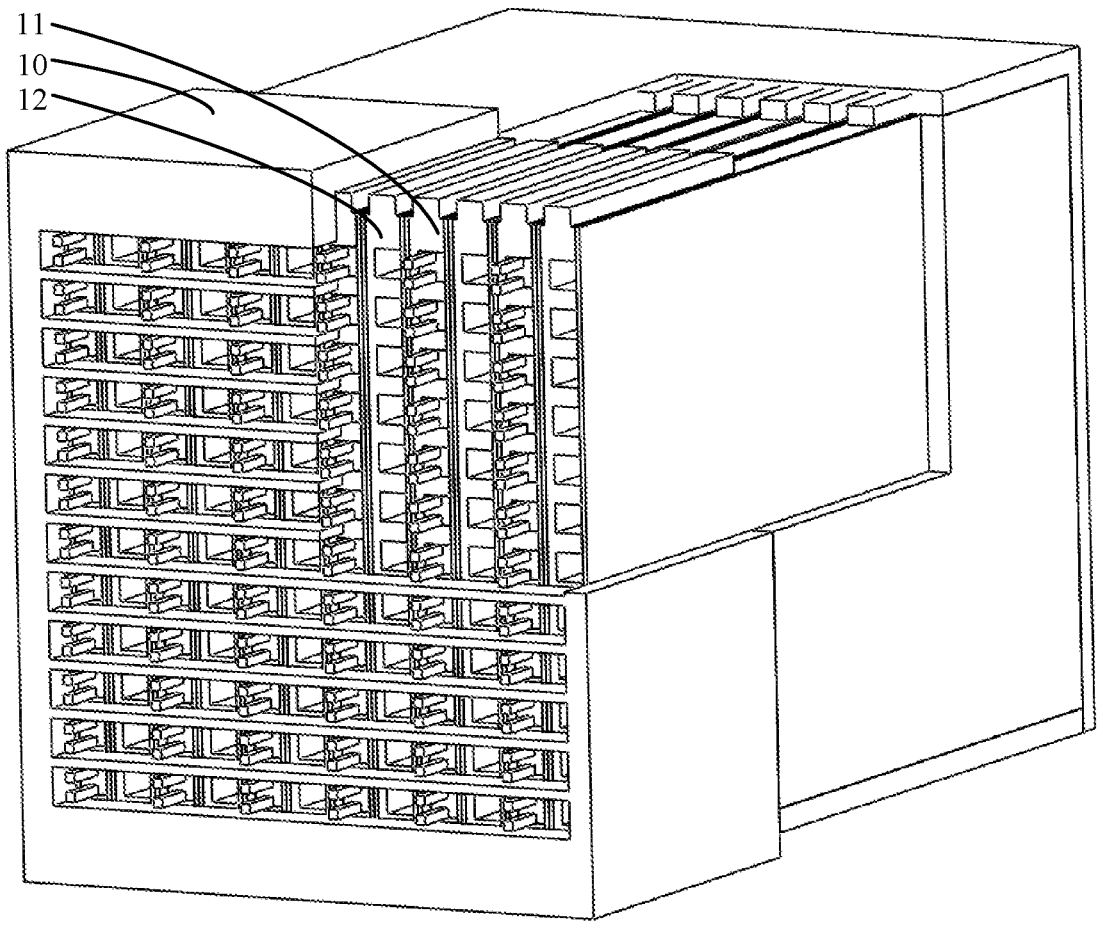
FIG. 5 is a sectional view of a connector according to an embodiment of the present disclosure.

In some examples, as shown in FIG. 4 and FIG. 5, the N/M serial connector 1 may further include a placeholder module 12. The placeholder module 12 and the first terminal module 11 are arranged in the thickness direction. The placeholder module 12 is fastened in the first housing 10, and occupies the vacancy 100 in the first housing 10.

The placeholder module 12 does not include a terminal pair configured to transmit an electrical signal, and the placeholder module 12 may be a plastic component.

According to the solution shown in this embodiment of the present disclosure, the placeholder module 12 is used for placeholder the vacancy 100 in the first housing 10, so that an overall structure of the N/M serial connector 1 is more stable. In addition, the placeholder module 12 does not include a metal terminal pair, and therefore costs are relatively low, so that costs of the N/M serial connector 1 do not increase greatly due to introduction of the placeholder module 12.

A specific structure of the placeholder module 12 is not limited in this embodiment of the present disclosure, provided that the placeholder module 12 can ensure that the remaining first terminal module 11 is stable in the first housing 10 and that a position of the remaining first terminal module 11 does not deviate, to ensure that a docking capability of the N/M serial connector 1 remains unchanged compared with that of the full connector.

Figure 8:
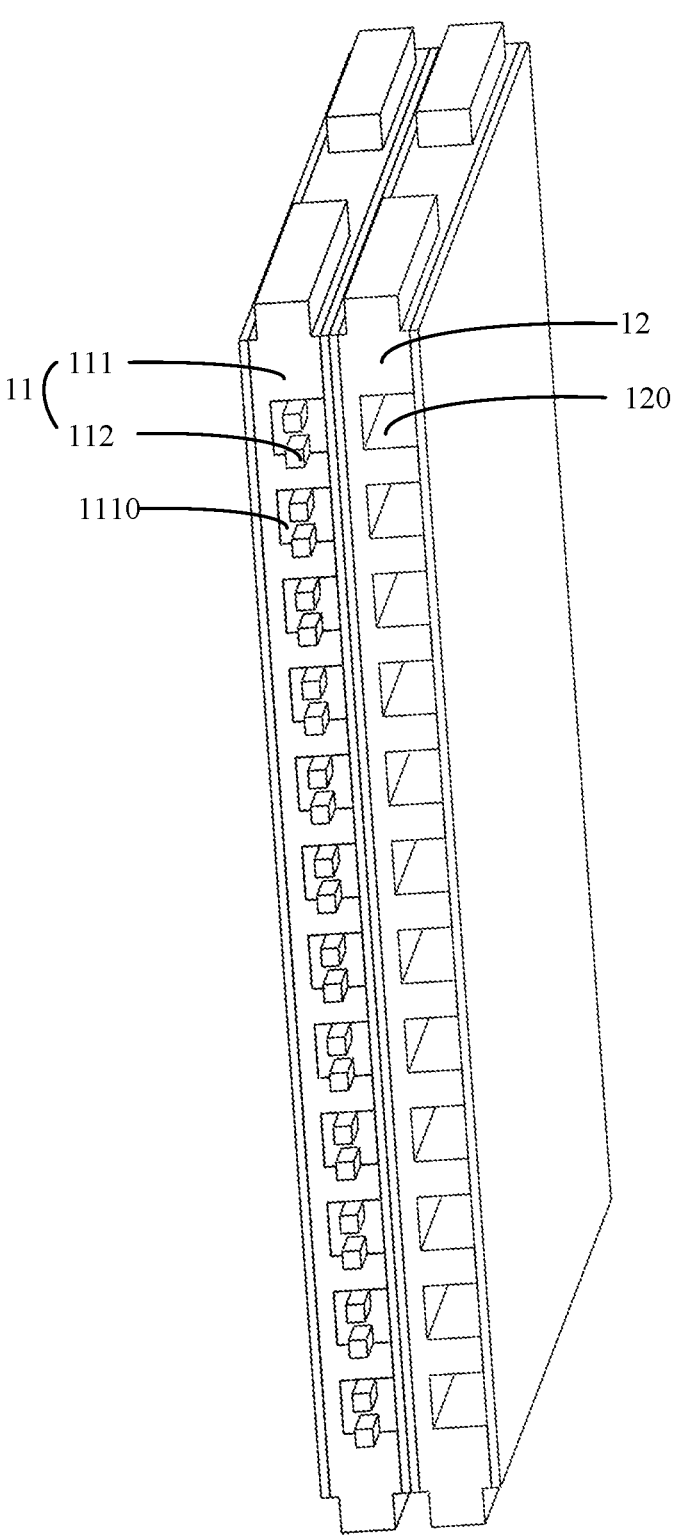
FIG. 8 is a schematic diagram of a first terminal module and a placeholder module according to an embodiment of the present disclosure.
Figure 9:
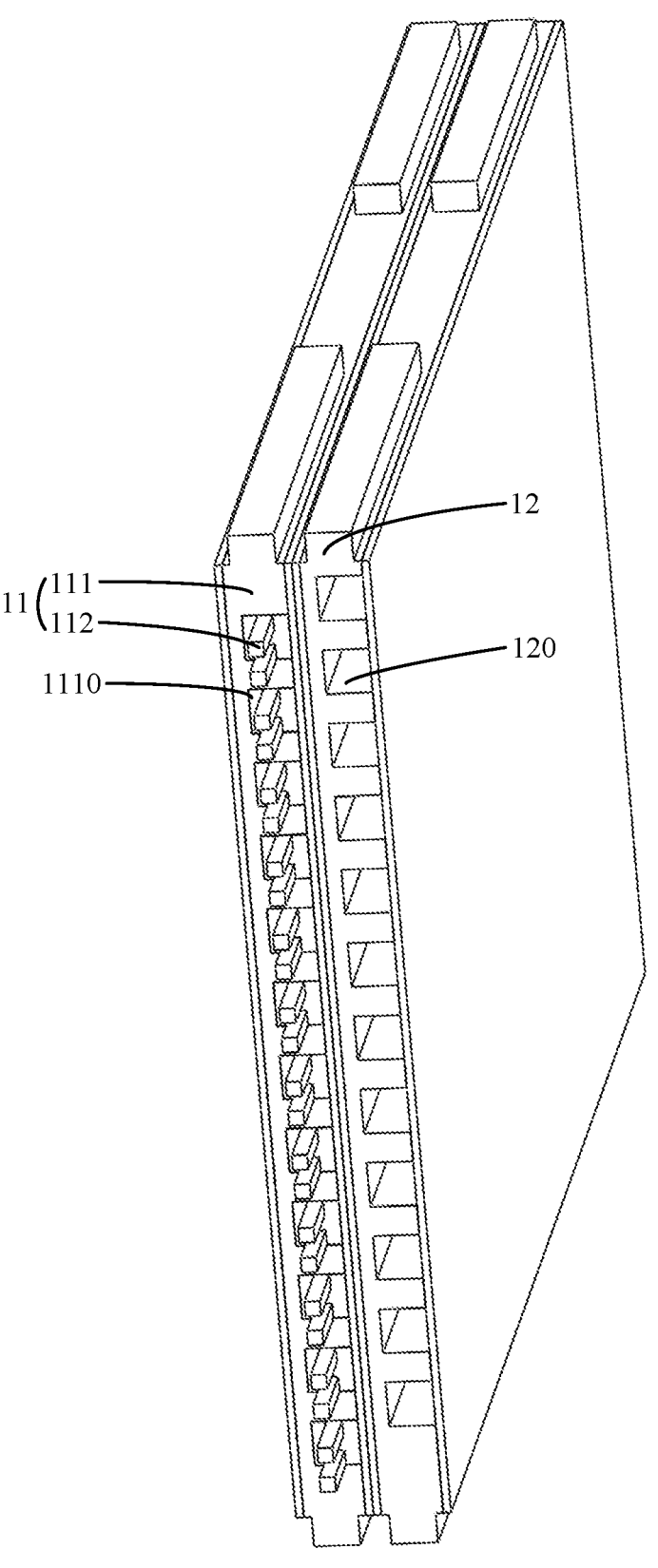
FIG. 9 is a schematic diagram of a first terminal module and a placeholder module according to an embodiment of the present disclosure.

In some examples, as shown in FIG. 8 and FIG. 9, the placeholder module 12 is a support member that can support a terminal pair, the placeholder module 12 includes at least one terminal accommodating structure 120, and the at least one terminal accommodating structure 120 is vacant.

In some examples, the placeholder module 12 may be a support member in a replaced terminal module in the connector. That is, the N/M serial connector 1 may be formed by removing all terminal pairs in one or more terminal modules in the full connector, and the placeholder module 12 is the remaining support member after the terminal pairs are removed from the terminal module.

For example, as shown in FIG. 8, the first terminal module 11 includes a first support member 111 and at least one first terminal pair 112, and the at least one first terminal pair 112 is fastened on the first support member 111. The placeholder module 12 is the same as the first support member 111.

The first terminal pair 112 is configured to transmit an electrical signal. The first terminal pair 112 may be a ground terminal pair, or may be a signal terminal pair, or may be a signal terminal and a ground terminal. This is not limited in this embodiment of the present disclosure.

For another example, as shown in FIG. 9, the first terminal module 11 includes a first support member 111 and a first terminal pair 112, the first support member 111 includes a first terminal accommodating structure 1110, and the first terminal pair 112 is fastened in the first terminal accommodating structure 1110. Both the terminal accommodating structure 120 in the placeholder module 12 and the first terminal accommodating structure 1110 in the first support member 111 are arranged in a first direction, and the terminal accommodating structure 120 and the first terminal accommodating structure 1110 are alternated one after another in the first direction.

The first terminal pair 112 may be fastened in all the first terminal accommodating structures 1110 in the first support member 111, or the first terminal pair 112 may be fastened in some first terminal accommodating structures 1110 in the first support member 111.

According to the solution shown in this embodiment of the present disclosure, the support member that can support the terminal pair is used as the placeholder module 12, so that no additional production line needs to be disposed to produce the placeholder module 12, thereby reducing production costs of the placeholder module 12.

In addition, the support member that can support the terminal pair is used as the placeholder module 12, so that the placeholder module 12 and the first terminal module 11 (or the first support member 111) are well matched, the placeholder module 12 and the first housing 10 are well matched, and a structure of the N/M serial connector 1 is more stable.

In some examples, in addition to the support member that can support the terminal pair, the placeholder module 12 may alternatively be a placeholder plate, and the placeholder plate has a plate structure. For example, the placeholder plate may be a plastic plate, and has no terminal accommodating structure.

In some examples, thicknesses of the placeholder module 12 and the first terminal module 11 are equal.

According to the solution shown in this embodiment of the present disclosure, the thicknesses of the placeholder module 12 and the first terminal module 11 are set to be equal. In this way, regardless of how a position and quantity of placeholder module 12 change (while M remains unchanged), it can be ensured that, compared with a full connector, the remaining first terminal module 11 is stable in the first housing 10 and a position of the first terminal module 11 does not deviate, thereby ensuring that a docking capability of the N/M serial connector 1 remains unchanged.

It should be noted that structures of the plurality of placeholder modules 12 included in the N/M serial connector 1 may be the same or may be different. This is not limited in this embodiment of the present disclosure. In addition, the plurality of first terminal modules 11 included in the N/M serial connector 1 may be the same or may be different. This is not limited in this embodiment of the present disclosure. Specifically, the plurality of first terminal modules 11 included in the N/M serial connector 1 may include a same quantity of first terminal pairs 112, or may include different quantities of the first terminal pairs 112.

A ratio of a quantity of first terminal modules 11 to a quantity of placeholder modules 12 is not limited in this embodiment of the present disclosure. A specific ratio may be determined depending on a specific specification of the board (for example, a line card board). When the specification of the board is relatively low, a ratio of a quantity of first terminal modules 11 to a quantity of placeholder modules 12 is set to a relatively small value, that is, a relatively large quantity of placeholder modules 12 are disposed. When the specification of the board is relatively high, a ratio of a quantity of first terminal modules 11 to a quantity of placeholder modules 12 is set to a relatively large value, that is, a relatively small quantity of placeholder modules 12 are disposed.

In addition, during actual production, considering that types of N/M serial connectors 1 produced in the factory are more, costs of the factory are higher, and it is not necessary to produce one type of N/M serial connector 1 for each board of each specification, but one or more types of N/M serial connectors 1 may be fixed.

Figure 7:
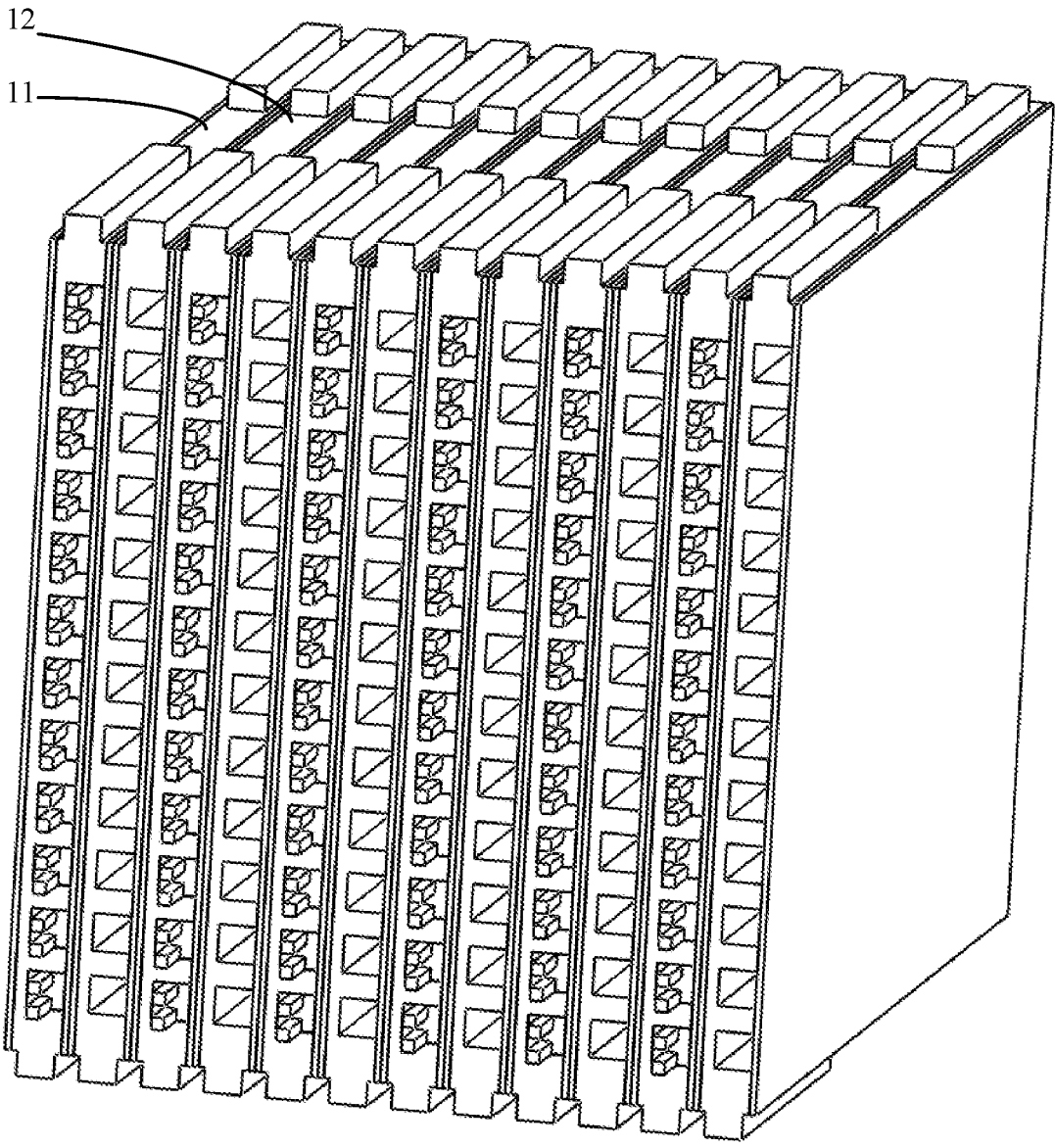
FIG. 7 is a schematic diagram of an arrangement of a first terminal module and a placeholder module according to an embodiment of the present disclosure.

In some examples, as shown in FIG. 7, a ratio of a quantity of first terminal module 11 to a quantity of placeholder module 12 is 1:1. That is, FIG. 7 shows a ½ serial connector. When the specification of the connector required by the board is greater than a specification of the ½ serial connector, the connector in which the first terminal module 11 is not removed is selected regardless of specific specifications. When the specification of the connector required by the board is less than or equal to the specification of the ½ serial connector, the ½ serial connector is selected regardless of specific specifications.

Certainly, a ratio of a quantity of first terminal module 11 to a quantity of placeholder module 12 may be set to another ratio, for example, 1:3 (a ¼ serial connector) and 3:1 (a ¾ serial connector).

A specific arrangement of the first terminal module 11 and the placeholder module 12 is not limited in this embodiment of the present disclosure. A specific arrangement may be determined depending on an actual connection relationship between the switch fabric unit and the line card board. In the connection relationship, it is determined which first terminal pairs 112 are used. The first terminal module 11 in which the first terminal pairs 112 are located needs to be reserved, and is not replaced with the placeholder module 12.

In some examples, the first terminal modules 11 are consecutively arranged, and the placeholder modules 12 are consecutively arranged. That is, the first terminal module 11 and the placeholder module 12 in the N/M serial connector 1 are separately located on two sides of the connector, and are not alternated.

For example, quantities of the first terminal modules 11 and the placeholder modules 12 are both 6, the six first terminal modules 11 are consecutively arranged, the six placeholder modules 12 are consecutively arranged, and the first terminal modules and the placeholder modules are separately located on the two sides of the connector.

In some other examples, the first terminal module 11 and the placeholder module 12 are alternately arranged. An alternate arrangement is any arrangement other than that the first terminal modules 11 are consecutively arranged and the placeholder modules 12 are consecutively arranged.

For example, as shown in FIG. 7, quantities of the first terminal modules 11 and the placeholder modules 12 are the same, and the first terminal modules 11 and the placeholder modules 12 are alternately arranged one after another. Certainly, the alternate arrangement may alternatively be in another form. This is not limited in this embodiment of the present disclosure.

The following describes components involved in the N/M serial connector 1 in more detail with examples.

Figure 6:
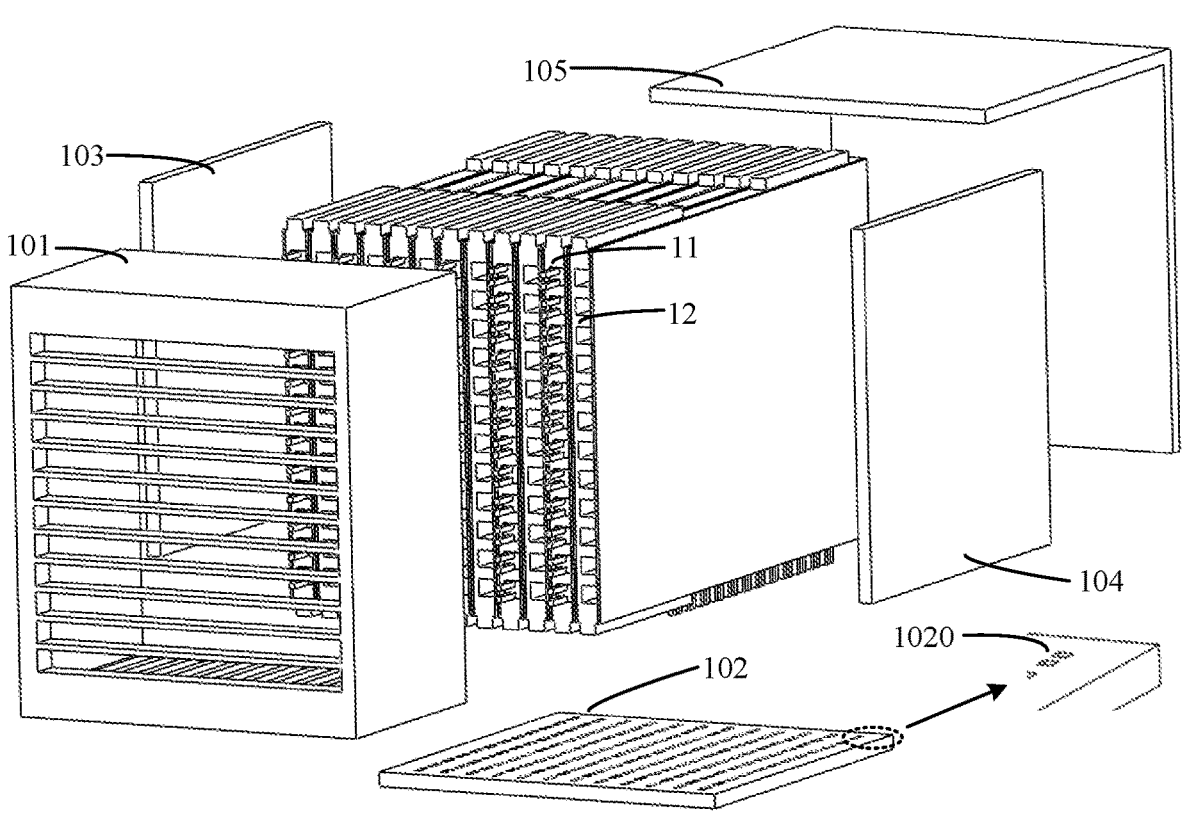
FIG. 6 is an exploded view of a connector according to an embodiment of the present disclosure.

As shown in FIG. 6, the first housing 10 includes a first front housing 101, a first bottom plate 102, a first right side clamping plate 103, a first left side clamping plate 104, and a first reinforcing plate 105. The first front housing 101 covers at a docking end of the first terminal module 11 and the placeholder module 12, to protect the first terminal module 11 and the placeholder module 12, and can provide a guiding function when docking with a connector on a peer side. There may be a plurality of slots inside the first front housing 101, and each first terminal module 11 and each placeholder module 12 may occupy one slot. The first bottom plate 102 is located on a bottom side of the first terminal module 11 and the placeholder module 12. The first bottom plate 102 has a plurality of first terminal holes 1020, and the first terminal holes 1020 are for the first terminal pair 112 to pass through one end at a board side.

The first right side clamping plate 103 is located on the right side of the first terminal module 11 and the placeholder module 12, and the first left side clamping plate 104 is located on the left side of the first terminal module 11 and the placeholder module 12. The first reinforcing plate 105 is L-shaped and is located at rear ends of the first terminal module 11 and the placeholder module 12, and the first reinforcing plate 105 fastens the first left side clamping plate 104 and the first right side clamping plate 103, to clamp the first terminal module 11 and the placeholder module 12.

Figure 10:
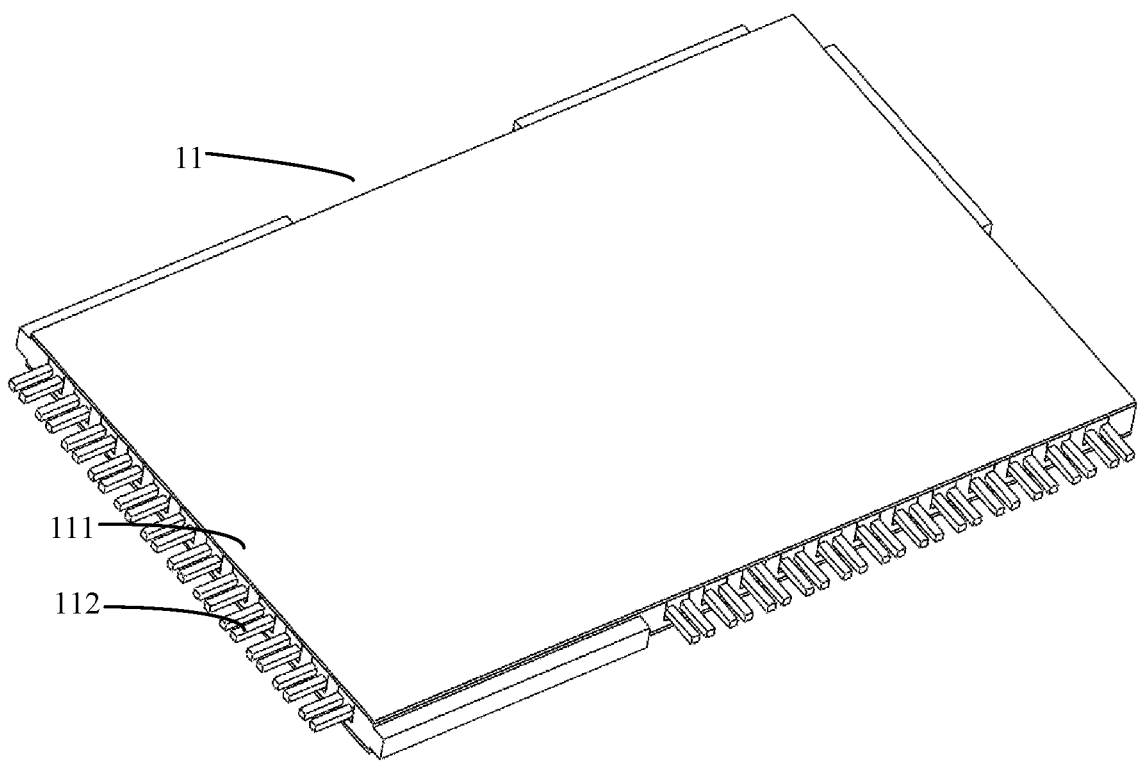
FIG. 10 is a schematic diagram of a first terminal module according to an embodiment of the present disclosure.
Figure 11:
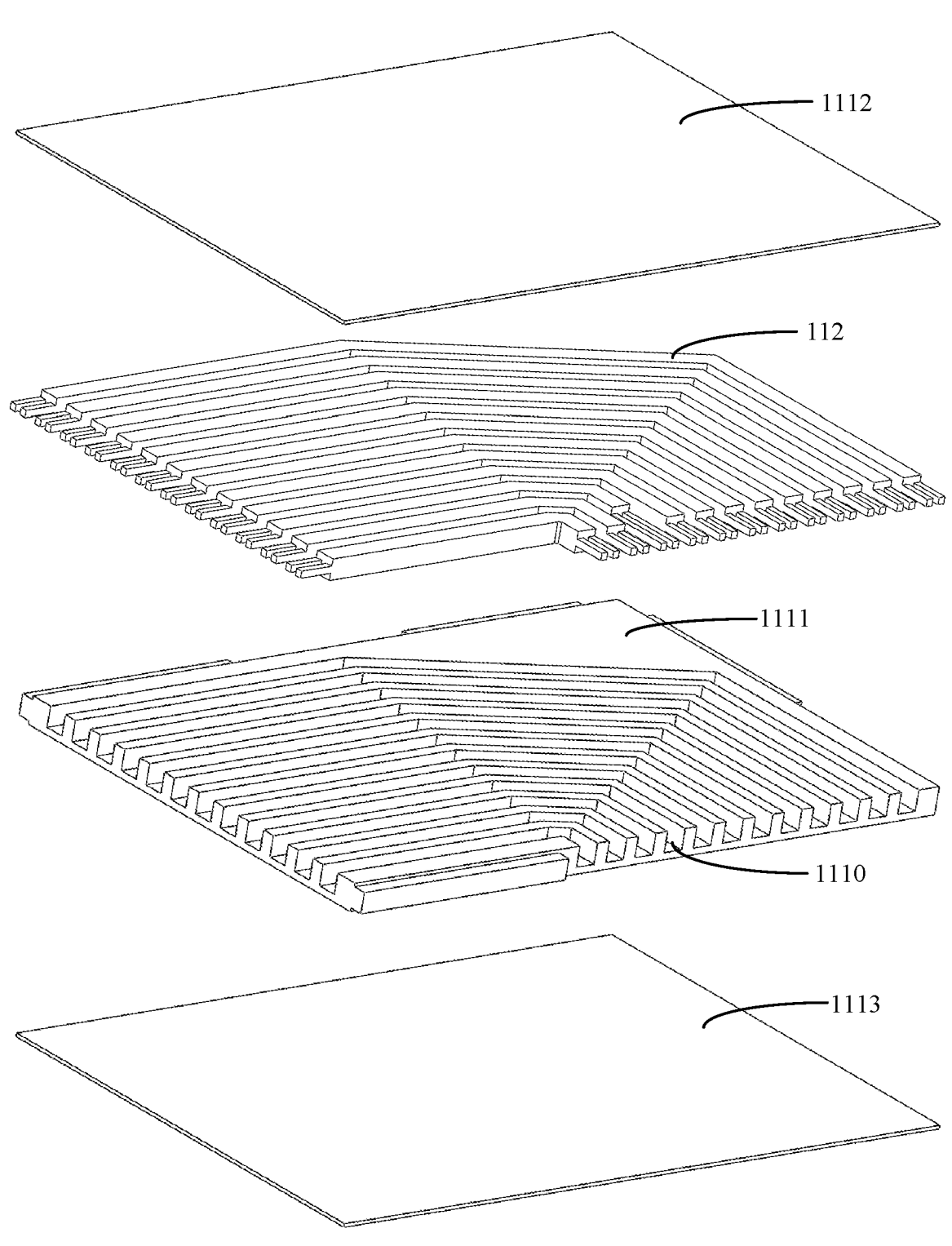
FIG. 11 is an exploded view of a first terminal module according to an embodiment of the present disclosure.

As shown in FIG. 10, the first terminal module 11 includes the first support member 111 and the first terminal pair 112, and the first terminal pair 112 is fastened on the first support member 111. As shown in FIG. 11, the first support member 111 includes a first fastening plate 1111, a first shielding piece 1112, and a second shielding piece 1113. The first fastening plate 1111 is a plastic component, and a first terminal accommodating structure 1110 (the first terminal accommodating structure 1110 includes a groove) is disposed on one side of the first fastening plate 1111. The first shielding piece 1112 and the second shielding piece 1113 are located on two sides of the first fastening plate 1111, and are both fastened to connect to the first fastening plate 1111. The first shielding piece 1112 closes an opening of the first terminal accommodating structure 1110. The first terminal pair 112 is located in the first terminal accommodating structure 1110.

Figure 12:
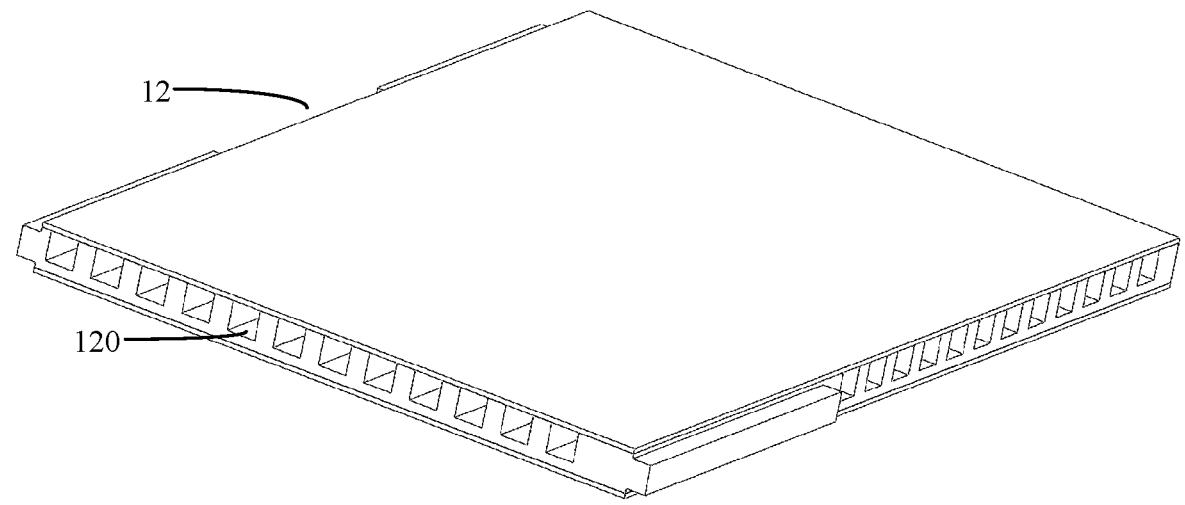
FIG. 12 is a schematic diagram of a placeholder module according to an embodiment of the present disclosure.
Figure 13:
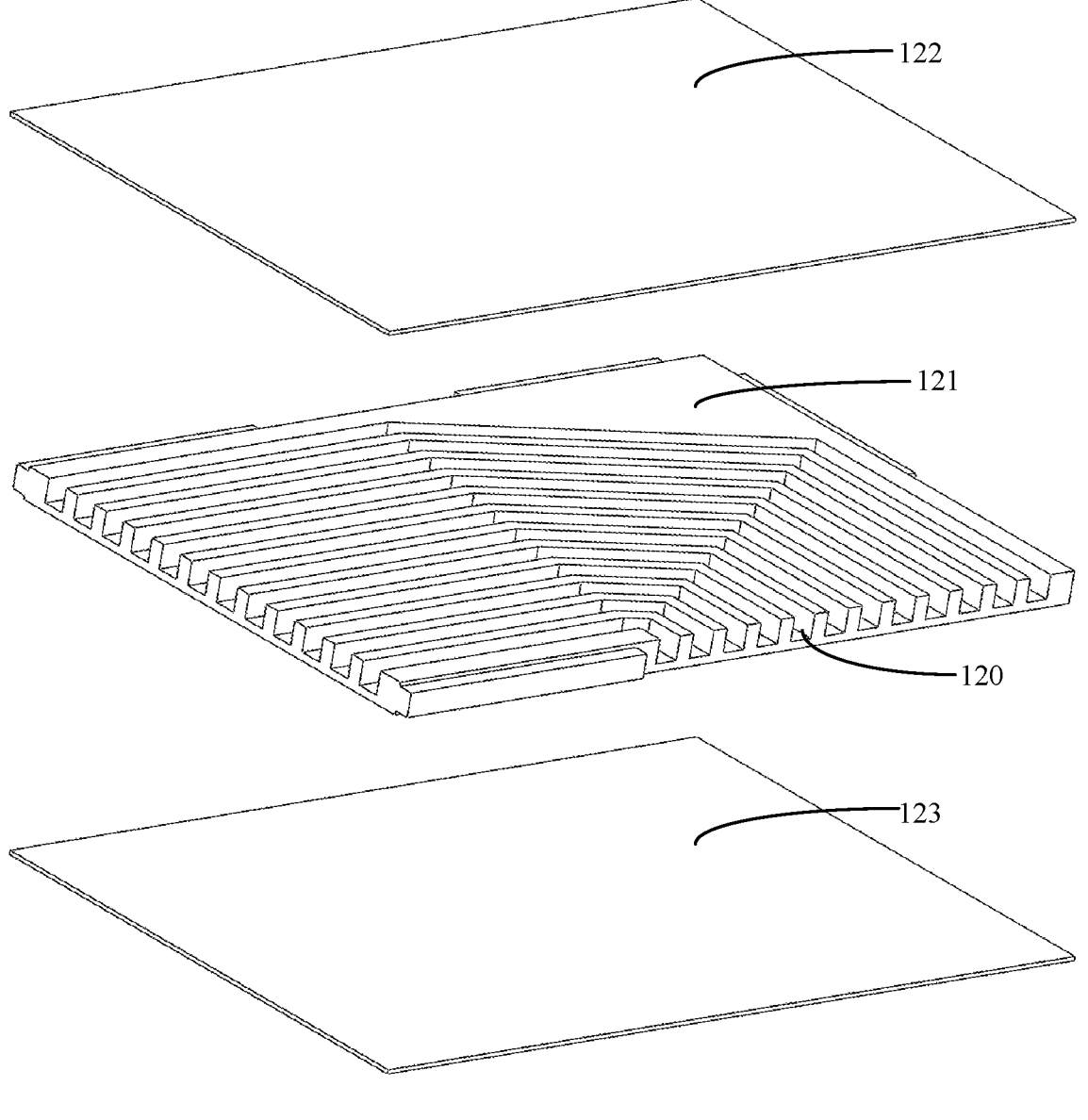
FIG. 13 is an exploded view of a placeholder module according to an embodiment of the present disclosure.

As shown in FIG. 12, the placeholder module 12 is a support member that can support a terminal pair, and has a vacant terminal accommodating structure 120. As shown in FIG. 13, the placeholder module 12 includes a placeholder fastening plate 121, a third shielding piece 122, and a fourth shielding piece 123. The placeholder fastening plate 121 is a plastic component, and a terminal accommodating structure 120 (the terminal accommodating structure 120 includes a groove) is disposed on one side of the placeholder fastening plate 121. The third shielding piece 122 and the fourth shielding piece 123 are located on two sides of the placeholder fastening plate 121, and are both fastened to connect to the placeholder fastening plate 121. The third shielding piece 122 closes an opening of the terminal accommodating structure 120.

It should be noted that the N/M serial connector 1 may be the first connector c or the second connector d in the frame device. This is not limited in this embodiment of the present disclosure. The N/M serial connector 1 may be a male connector (for example, a curved male connector), or may be a female connector (for example, a curved female connector). This is not limited in this embodiment of the present disclosure.

Figure 14:
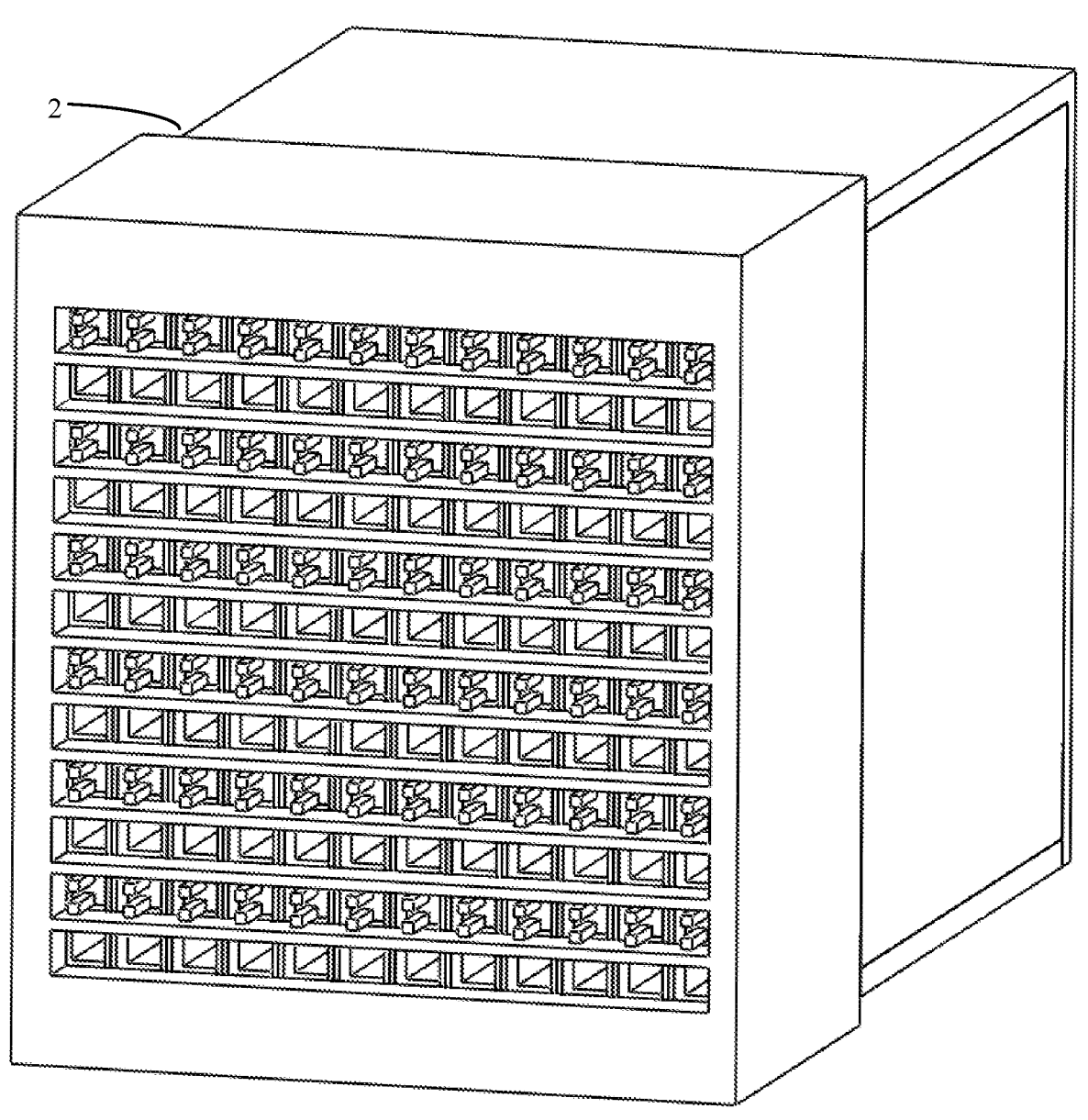
FIG. 14 is a schematic diagram of a connector according to an embodiment of the present disclosure.
Figure 15:
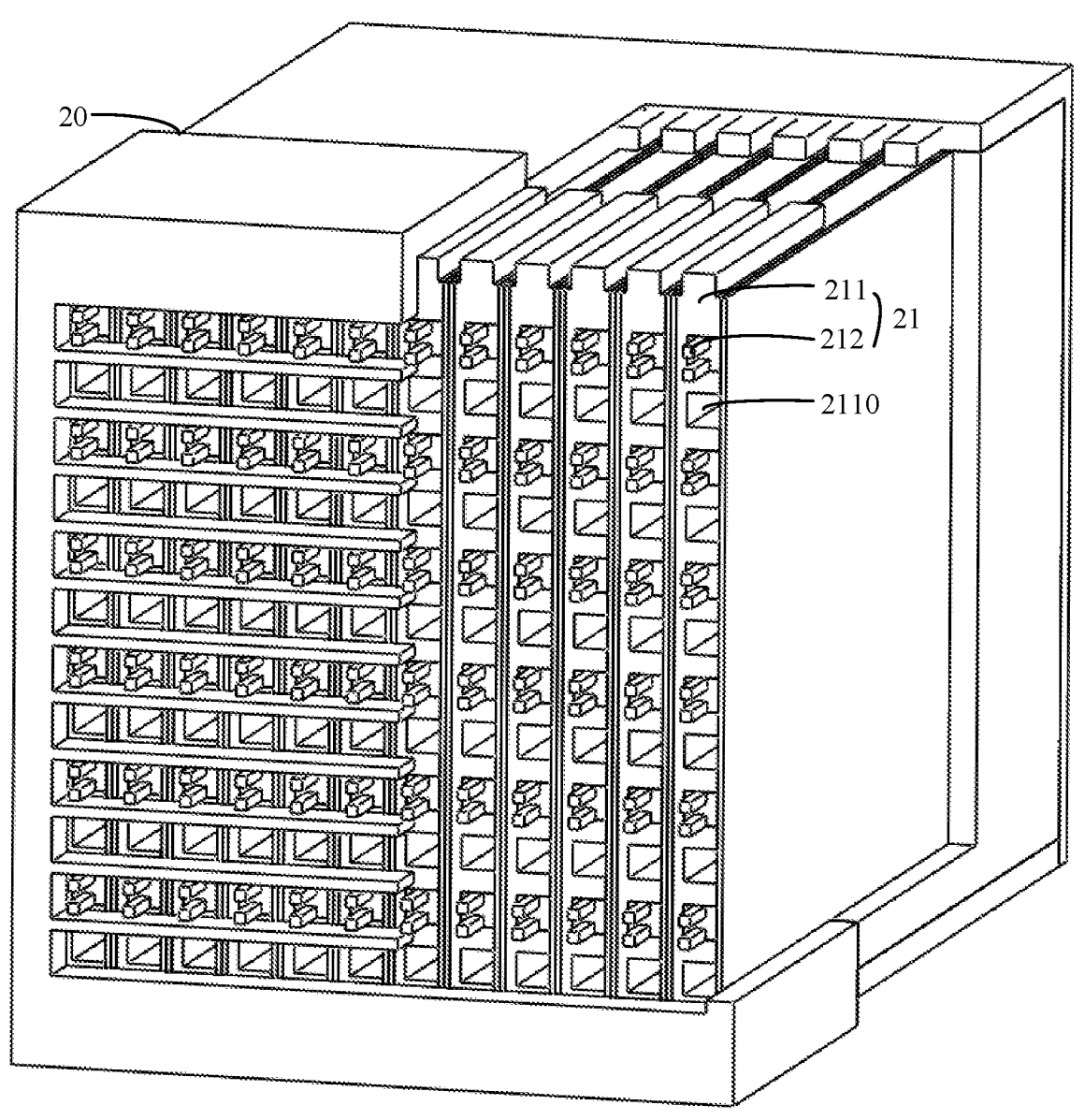
FIG. 15 is a sectional view of a connector according to an embodiment of the present disclosure.

An embodiment of the present disclosure further provides a connector. As shown in FIG. 14 and FIG. 15, the connector includes a second housing 20 and a plurality of second terminal modules 21. The plurality of second terminal modules 21 are arranged in a thickness direction and are fastened in the second housing 20. The second terminal module 21 includes a second support member 211 and at least one second terminal pair 212. The second support member 211 includes a plurality of second terminal accommodating structures 2110, each second terminal pair 212 is fastened in one second terminal accommodating structure 2110, and at least one second terminal accommodating structure 2110 is vacant.

The second terminal module 21 may also be referred to as a wafer.

The second support member 211 is a structure member for supporting the second terminal pair 212, and includes a plurality of second terminal accommodating structures 2110. The second terminal pair 212 is configured to transmit an electrical signal, and may be a ground terminal pair, a signal terminal pair, or a signal terminal and a ground terminal. This is not limited in this embodiment of the present disclosure.

Figure 17:
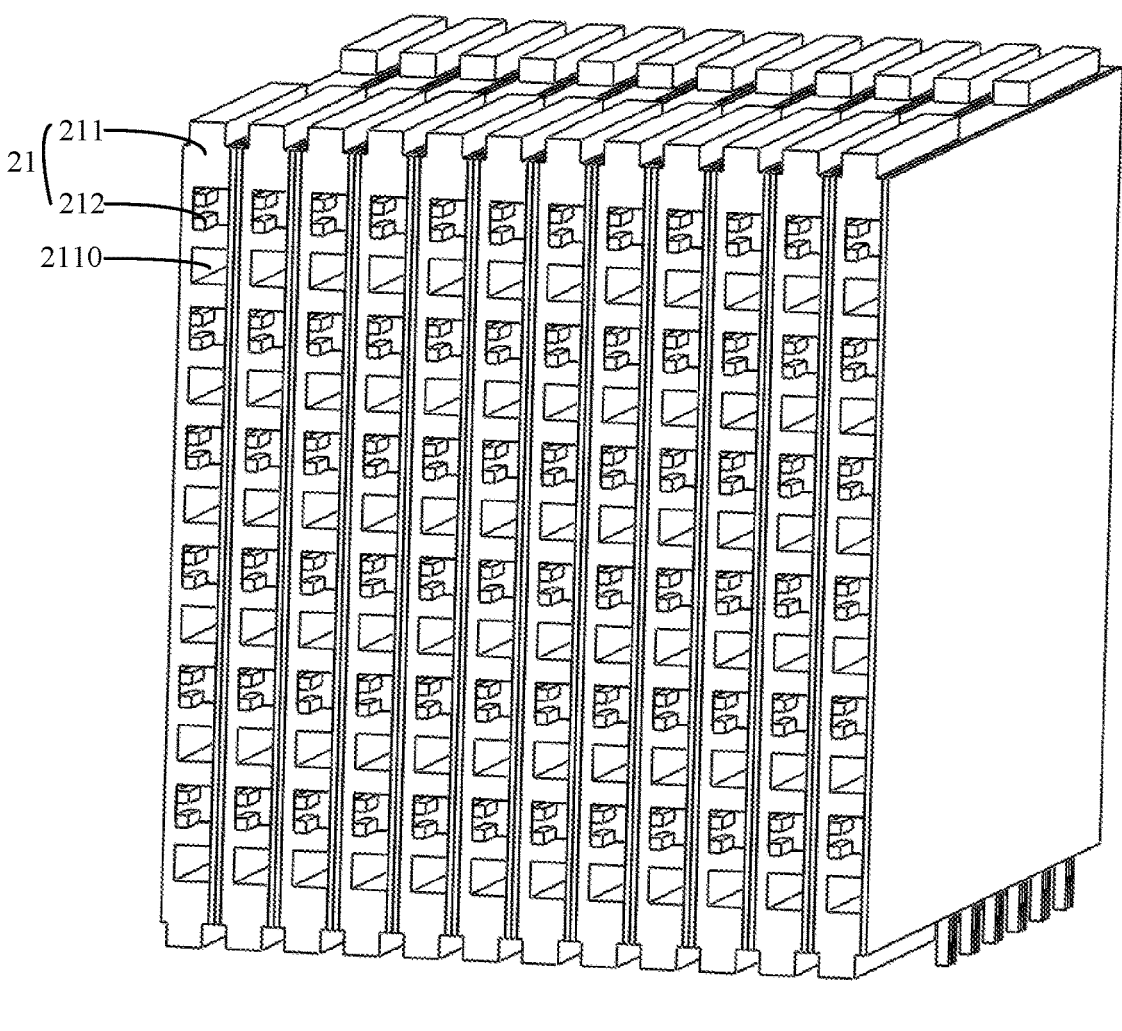
FIG. 17 is a schematic diagram of an arrangement of a second terminal module according to an embodiment of the present disclosure.

A second terminal pair 212 is fastened in all second terminal accommodating structures 2110 of a second support member 211 of a connector in a related technology. For ease of description, this type of connector in the related technology may be referred to as a full connector. However, some second terminal accommodating structures 2110 of the second support member 211 of the connector provided in this embodiment of the present disclosure is in a vacant state. For ease of description, the connector provided in the present disclosure may be referred to as a Y/X serial connector 2. X is a quantity of second terminal accommodating structures 2110, and Y is a quantity of second terminal pairs 212. For example, FIG. 17 shows a ½ serial connector.

According to the solution shown in this embodiment of the present disclosure, some second terminal pairs 212 in the connector are removed to form the Y/X serial connector 2, so that a quantity of second terminal pairs 212 included in the Y/X serial connector 2 is reduced, and costs are reduced. In addition, only some second terminal pairs 212 are removed, and an outline dimension of the Y/X serial connector 2 remains unchanged, so that docking capability of the Y/X serial connector 2 remains unchanged. That is, compared with the full connector, the Y/X serial connector 2 includes a different quantity of second terminal pairs 212 (that is, a specification is different), but can dock with a same peer connector.

In addition, a plurality of types of Y/X serial connectors 2 may be formed based on different quantities of the vacant second terminal accommodating structures 2110 in the Y/X serial connector 2, and the plurality of types of Y/X serial connectors 2 have different specifications, but can dock with a same peer connector.

In this way, in a frame device, a user may select a Y/X serial connector 2 of a corresponding specification based on an actual specification of a line card board, instead of selecting connectors of a same high specification uniformly, so that waste of terminal pairs and costs of the frame device are reduced. In addition, the user can select a Y/X serial connector 2 of a different specification based on an actual specification of a switch fabric unit to form a series of frame devices of different specifications. In addition, these series of frame devices of different specifications have Y/X serial connectors 2 with the same docking capability, and therefore can support mixed use of line card boards.

In this embodiment of the present disclosure, a ratio of a quantity of second terminal accommodating structures 2110 in which the second terminal pair 212 is fastened to a quantity of vacant second terminal accommodating structures 2110 is not limited. A specific ratio may be determined depending on a specific specification of the board (for example, a line card board). When the specification of the board is relatively low, the quantity is set to a relatively small value, that is, there are relatively many vacant second terminal accommodating structures 2110. When the specification of the board is relatively high, the quantity is set to a relatively large value, that is, there are relatively few vacant second terminal accommodating structures 2110.

In addition, during actual production, considering that types of Y/X serial connectors 2 produced in the factory are more, costs of the factory are higher, and it is not necessary to produce one type of Y/X serial connector 2 for each board of each specification, but one or more types of Y/X serial connectors 2 may be fixed.

In some examples, as shown in FIG. 17, a ratio of a quantity of second terminal accommodating structures 2110 in which the second terminal pair 212 is fastened to a quantity of vacant second terminal accommodating structures 2110 is 1:1, that is, a ½ serial connector. When the specification of the connector required by the board is greater than a specification of the ½ serial connector, the connector in which the second terminal pair 212 is not removed is selected regardless of specific specifications. When the specification of the connector required by the board is less than or equal to the specification of the ½ serial connector, the ½ serial connector is selected regardless of specific specifications.

Certainly, a ratio of a quantity of second terminal accommodating structures 2110 in which the second terminal pair 212 is fastened to a quantity of vacant second terminal accommodating structures 2110 may be set to another ratio, for example, 1:3 (a ¼ serial connector) and 3:1 (a ¾ serial connector).

In this embodiment of the present disclosure, which second terminal accommodating structures 2110 in the second support member 211 are vacant and which second terminal accommodating structures 2110 are for fastening the second terminal pair 212 are not limited. A specific arrangement may be determined depending on an actual connection relationship between the switch fabric unit and the line card board. In the connection relationship, it is determined which second terminal pairs 212 are used, and these second terminal pairs 212 need to be reserved.

In some examples, the second terminal accommodating structures 2110 in which the second terminal pair 212 is fastened are consecutively arranged, and the vacant second terminal accommodating structures 2110 in the second support member 211 are consecutively arranged in the second support member 211.

That is, in the Y/X serial connector 2, the second terminal accommodating structures 2110 in which the second terminal pair 212 is fastened and the vacant second terminal accommodating structures 2110 are separately located on two sides of the connector and are not alternated. For example, quantities of the second terminal accommodating structures 2110 in which the second terminal pair 212 is fastened and the vacant second terminal accommodating structures 2110 are both 6, and therefore the six second terminal accommodating structures 2110 in which the second terminal pair 212 is fastened are consecutively arranged, the six vacant second terminal accommodating structures 2110 are consecutively arranged, and the six second terminal accommodating structures 2110 in which the second terminal pair 212 and the six vacant second terminal accommodating structures 2110 are separately located on the two sides of the connector. It may alternatively be understood that a plurality of second terminal pairs 212 are consecutively arranged in the second terminal accommodating structure 2110 of the second support member 211.

In some other examples, the second terminal accommodating structure 2110 in which the second terminal pair 212 is fastened and the vacant second terminal accommodating structure 2110 are alternately arranged. An alternate arrangement refers to any arrangement other than the foregoing consecutive arrangement of the second terminal accommodating structures 2110 in which the second terminal pair 212 is fastened and the consecutive arrangement of the vacant second terminal accommodating structures 2110.

For example, as shown in FIG. 17, quantities of the second terminal accommodating structures 2110 in which the second terminal pair 212 is fastened and the vacant second terminal accommodating structures 2110 are the same, and the second terminal accommodating structures 2110 in which the second terminal pair 212 is fastened and the vacant second terminal accommodating structures 2110 are alternately arranged. Certainly, the alternate arrangement may alternatively be in another form. This is not limited in this embodiment of the present disclosure.

It should be noted that the plurality of second terminal modules 21 included in the Y/X serial connector 2 may be the same or may be different. This is not limited in this embodiment of the present disclosure. For example, the plurality of second terminal modules 21 may include a same quantity of second terminal pairs 212, or may include different quantities of the second terminal pairs 212. When the plurality of second terminal modules 21 include a same quantity of second terminal pairs 212, arrangements of the second terminal pairs 212 in the plurality of second terminal modules 21 may be the same or may be different.

For example, as shown in FIG. 17, the plurality of second terminal accommodating structures 2110 that are in the second support member 211 and in which the second terminal pair 212 is fastened are arranged in a same manner as the vacant second terminal accommodating structures 2110 in the second support member 211.

The following describes components involved in the Y/X serial connector 2 in more detail with examples.

Figure 16:
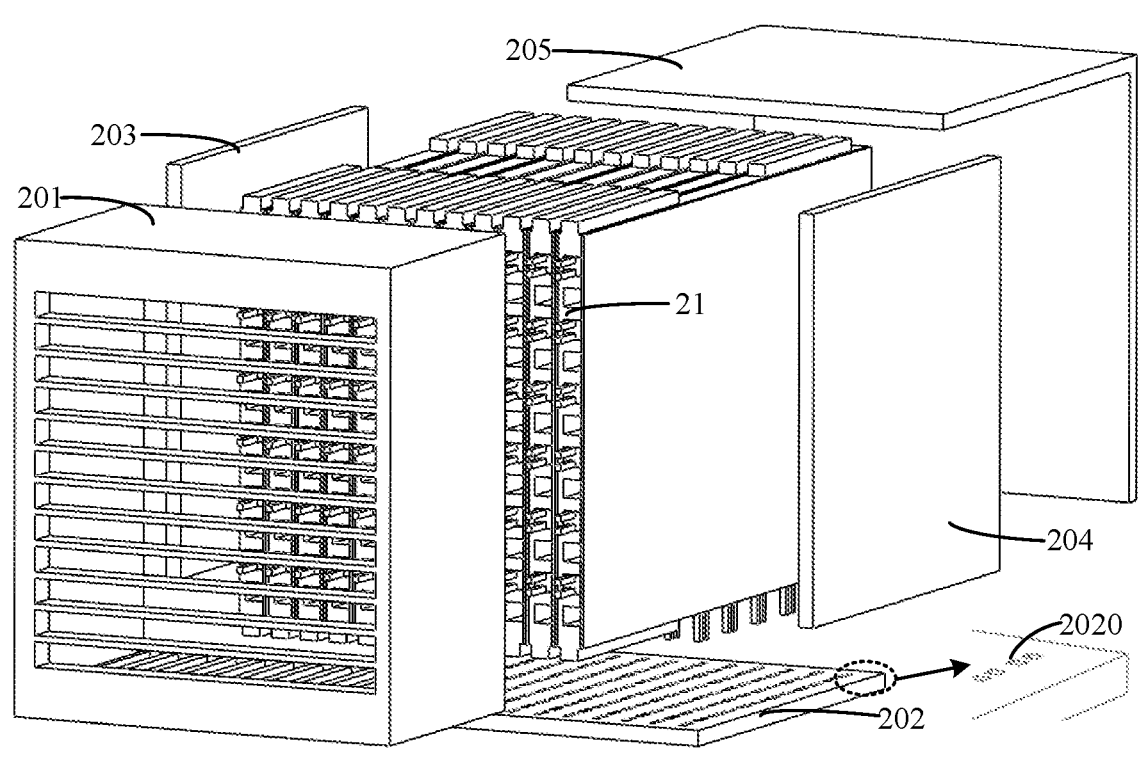
FIG. 16 is an exploded view of a connector according to an embodiment of the present disclosure.

As shown in FIG. 16, the second housing 20 includes a second front housing 201, a second bottom plate 202, a second right side clamping plate 203, a second left side clamping plate 204, and a second reinforcing plate 205. The second front housing 201 covers at a docking end of the second terminal module 21, to protect the second terminal module 21, and can provide a guiding function when docking with the connector on the peer side. There may be a plurality of slots inside the second front housing 201, and each second terminal module 21 may occupy one slot. The second bottom plate 202 is located on a bottom side of the second terminal module 21. The second bottom plate 202 has a plurality of second terminal holes 2020, and the second terminal holes 2020 are for the second terminal pair 212 to pass through one end at a board side.

The second right side clamping plate 203 is located on a right side of the second terminal module 21, and the second left side clamping plate 204 is located on a left side of the second terminal module 21. The second reinforcing plate 205 is L-shaped and is located at a rear end of the second terminal module 21, and the second reinforcing plate 205 fastens the second left side clamping plate 204 and the second right side clamping plate 203, to clamp the plurality of second terminal modules 21.

Figure 18:
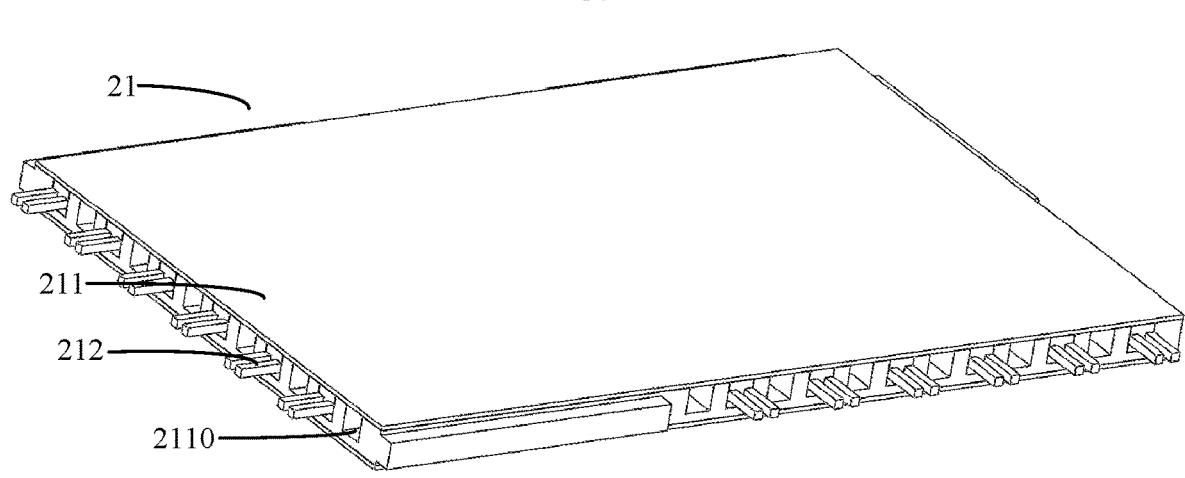
FIG. 18 is a schematic diagram of a second terminal module according to an embodiment of the present disclosure.

As shown in FIG. 18, the second terminal module 21 includes the second support member 211 and the second terminal pair 212. The second support member 211 includes a plurality of second terminal accommodating structures 2110, each second terminal pair 212 is located in one second terminal accommodating structure 2110, and some second terminal accommodating structures 2110 are vacant.

Figure 19:
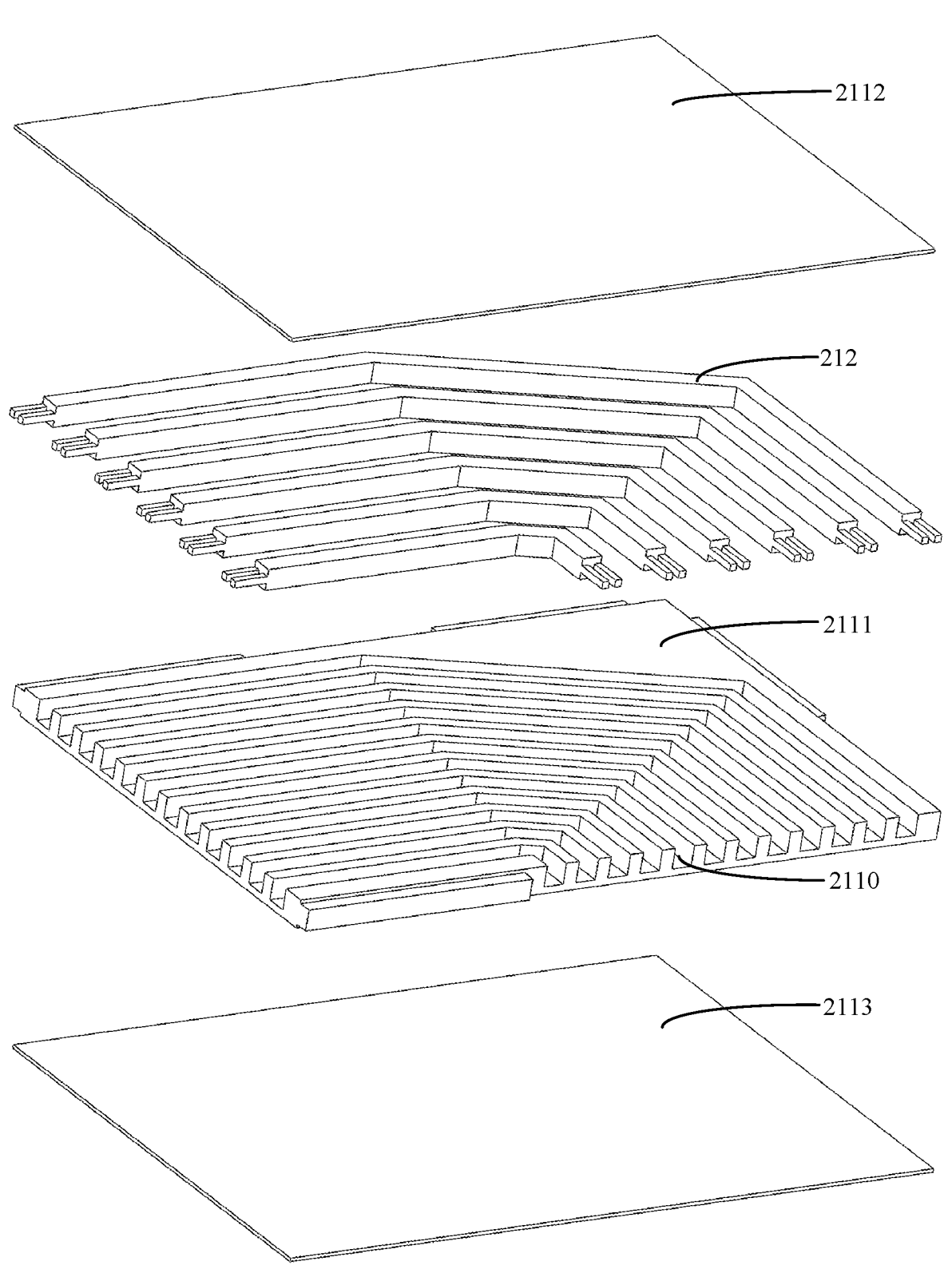
FIG. 19 is an exploded view of a second terminal module according to an embodiment of the present disclosure.

As shown in FIG. 19, the second support member 211 includes a second fastening plate 2111, a fifth shielding piece 2112, and a sixth shielding piece 2113. The second fastening plate 2111 is a plastic component, and a second terminal accommodating structure 2110 (the second terminal accommodating structure 2110 includes a groove) is disposed on one side of the second fastening plate 2111. The fifth shielding piece 2112 and the sixth shielding piece 2113 are located on two sides of the second fastening plate 2111, and are both fastened to connect to the second fastening plate 2111. The fifth shielding piece 2112 closes an opening of the second terminal accommodating structure 2110.

It should be noted that the Y/X serial connector 2 may be the first connector c or the second connector d in the frame device. This is not limited in this embodiment of the present disclosure. The Y/X serial connector 2 may be a male connector (for example, a curved male connector), or may be a female connector (for example, a curved female connector). This is not limited in this embodiment of the present disclosure.

An embodiment of the present disclosure further provides a frame device. As shown in FIG. 1, the frame device includes a first board a, a second board b, a first connector c, and a second connector d, and at least one of the first connector c and the second connector d is the connector provided in embodiments of the present disclosure. The first board a is electrically connected to a first end of the first connector c, and the second board b is electrically connected to a first end of the second connector d. A second end of the first connector c is electrically connected to a second end of the second connector d.

One of the first connector c and the second connector d is a male connector (for example, a curved male connector), and the other is a female connector (for example, a curved female connector).

According to the solution shown in embodiments of the present disclosure, the connector provided in this embodiment of the present disclosure is applied to the frame device, so that a quantity of terminal pairs in an idle state is reduced, and waste of terminal pairs is reduced, thereby reducing costs of the frame device.

In some examples, the first board a is a switch fabric unit, the second board b is a line card board, and the second connector d is the connector provided in embodiments of the present disclosure.

In this way, a user may select the second connector d of a proper specification based on a specific specification of the line card board, to reduce the waste of terminal pairs of the second connector as much as possible while meeting a requirement for signal transmission between the line card board and the switch fabric unit.

In addition, to enable the frame device to support mixed use of line card boards of a plurality of specifications, the first connector c may be a full connector.

Figure 20:
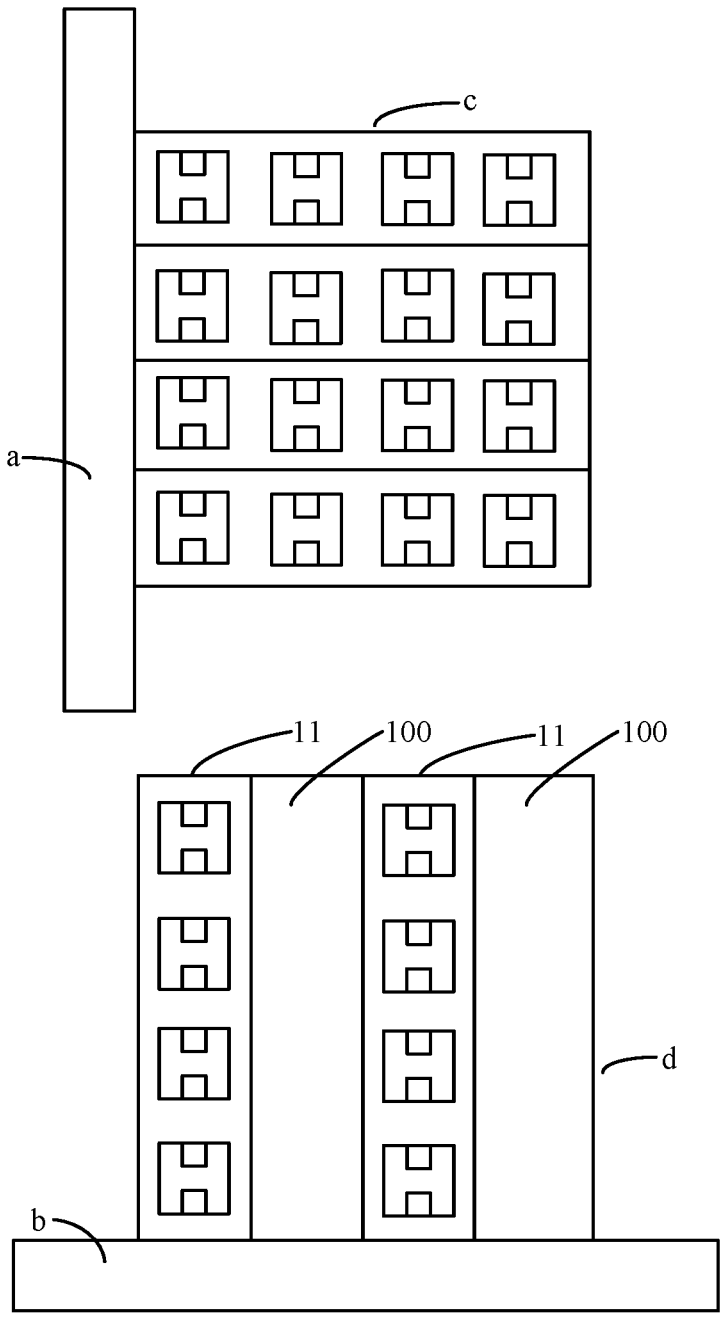
FIG. 20 is a schematic diagram of a frame device according to an embodiment of the present disclosure.

For example, as shown in FIG. 20, the first connector c is a full connector, and the second connector d is an N/M serial connector 1 (for example, a ½ serial connector) provided in embodiments of the present disclosure.

Figure 21:
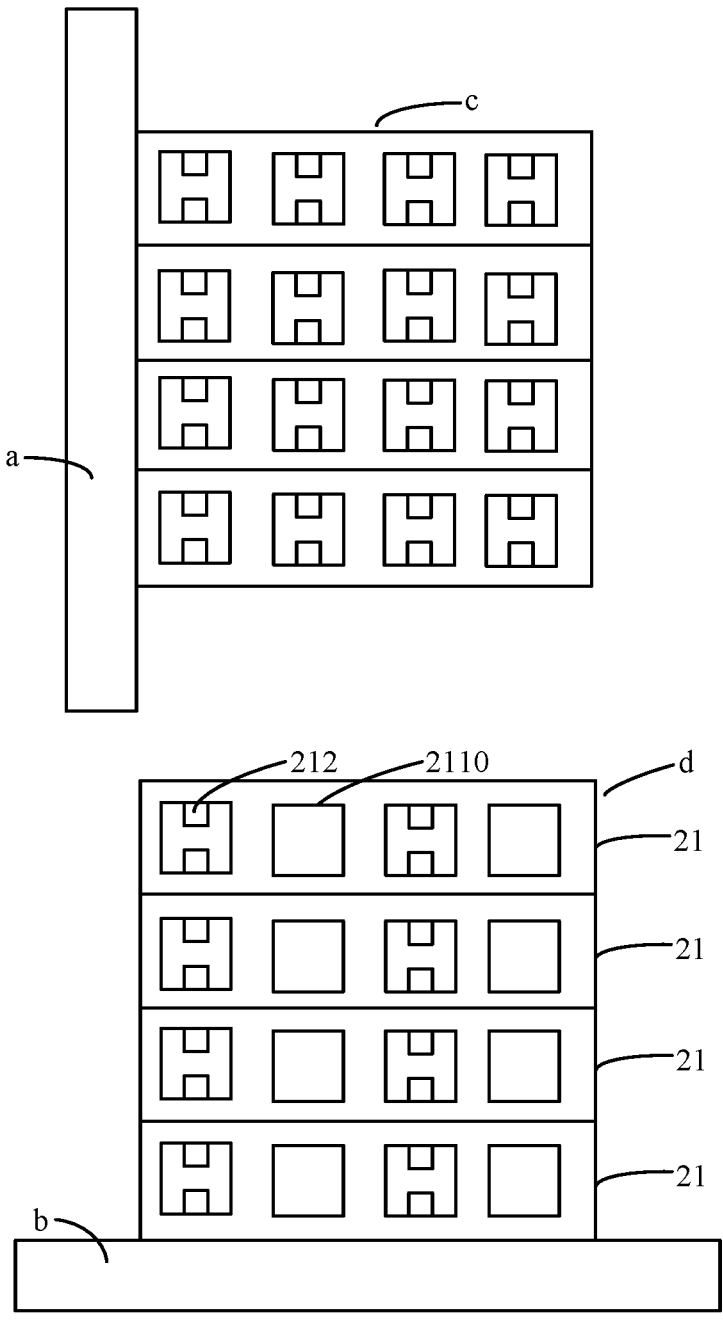
FIG. 21 is a schematic diagram of a frame device according to an embodiment of the present disclosure.

For example, as shown in FIG. 21, the first connector c is a full connector, and the second connector d is a Y/X serial connector 2 (for example, a ½ serial connector) provided in embodiments of the present disclosure.

In some examples, one of the first connector c and the second connector d is an N/M serial connector 1, and the other is a Y/X serial connector 2.

Figure 22:
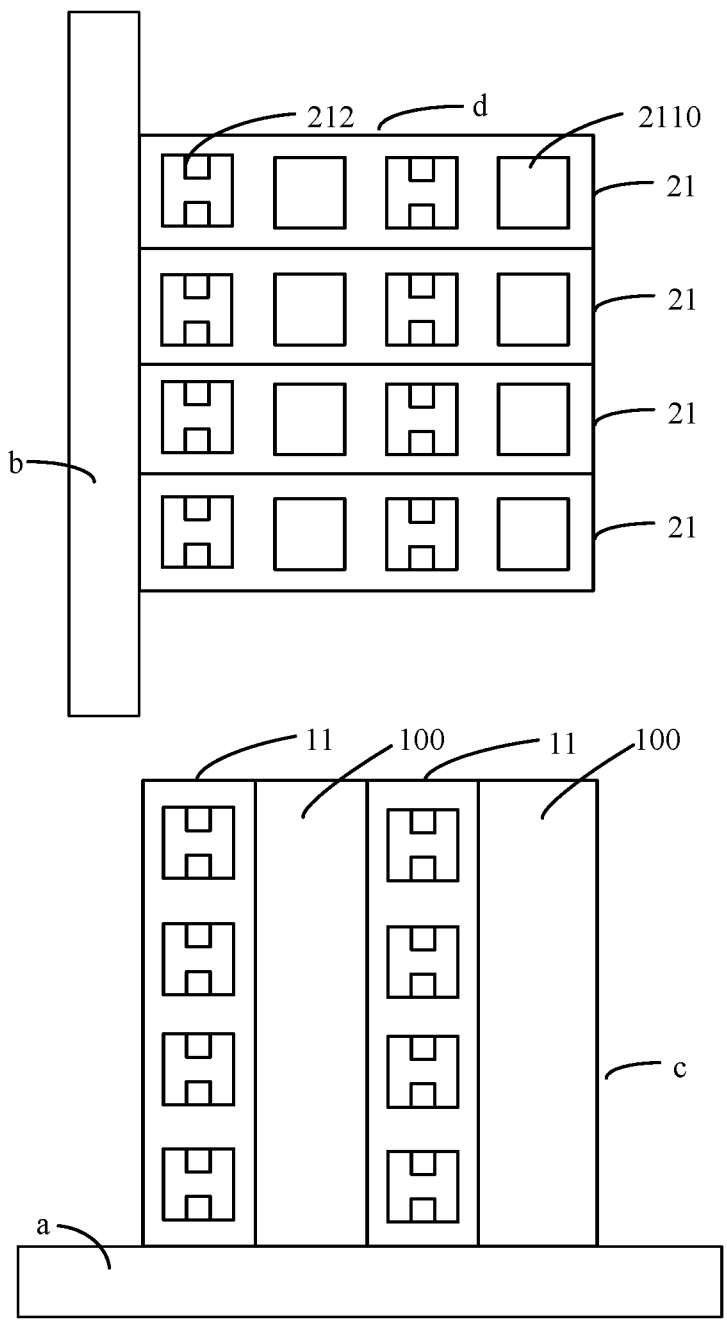
FIG. 22 is a schematic diagram of a frame device according to an embodiment of the present disclosure.

For example, as shown in FIG. 22, the first connector c is an N/M serial connector 1, the second connector d is a Y/X serial connector 2, and a position of a vacant second terminal accommodating structure 2110 of the second connector d corresponds to a position of a vacancy 100 of the first connector c.

Figure 23:
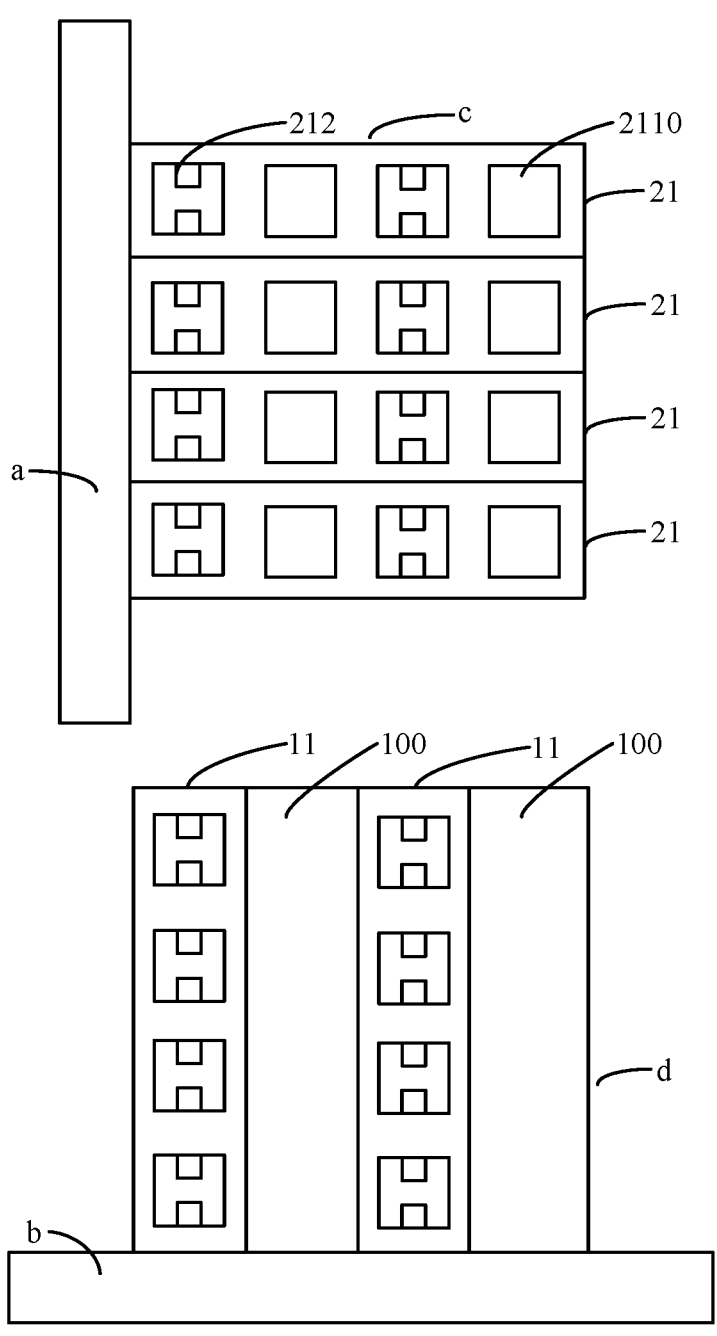
FIG. 23 is a schematic diagram of a frame device according to an embodiment of the present disclosure.

For example, as shown in FIG. 23, the first connector c is a Y/X serial connector 2, the second connector d is an N/M serial connector 1, and a position of a vacancy 100 of the second connector d corresponds to a position of a vacant second terminal accommodating structure 2110 of the first connector c.

An embodiment of the present disclosure further provides a connector assembly method. The method is used for assembling the foregoing N/M serial connector 1. The method includes: arranging at least one first terminal module 11 in a thickness direction, and fastening at least one first terminal module 11 in a first housing 10.

The first terminal module 11 is configured to transmit an electrical signal, where the first housing 10 in which the at least one first terminal module 11 is fastened has a vacancy 100.

In some examples, the connector further includes a placeholder module 12. When the at least one first terminal module 11 is arranged in the thickness direction and fastened in the first housing 10, the at least one first terminal module 11 and at least one placeholder module 12 may be arranged in the thickness direction and fastened in the first housing 10. In addition, the placeholder module 12 occupies the vacancy 100 in the first housing 10.

In some examples, when the first terminal module 11 and the placeholder module 12 are arranged in the thickness direction, the first terminal module 11 may be consecutively arranged, and the placeholder module 12 may be consecutively arranged.

In some examples, when the first terminal module 11 and the placeholder module 12 are arranged in the thickness direction, the first terminal module 11 and the placeholder module 12 may be alternately arranged.

For example, quantities of the first terminal modules 11 and the placeholder modules 12 are the same, and the first terminal modules 11 and the placeholder modules 12 may be alternately arranged one after another.

According to the solution shown in this embodiment of the present disclosure, the N/M serial connector 1 assembled by using the foregoing connector assembly method has a same outline dimension as a corresponding connector whose first terminal module 11 is not removed. Therefore, a docking capability remains unchanged, and a quantity of first terminal pairs 112 included in the N/M serial connector 1 is less than a quantity of terminal pairs in the connector whose first terminal module 11 is not removed. Therefore, costs of the N/M serial connector 1 are relatively low.

In the frame device, a user may select an N/M serial connector 1 of a corresponding specification based on an actual specification of a board (a line card board or a switch fabric unit), instead of selecting connectors of a same high specification uniformly, so that waste of terminal pairs and costs of the frame device are reduced.

An embodiment of the present disclosure further provides another connector assembly method. The method may be used for assembling the Y/X serial connectors 2. The method includes: fastening a second terminal pair 212 in each of some second terminal accommodating structures 2110 of the second support member 211, to form a second terminal module 21. The plurality of second terminal modules 21 are arranged in a thickness direction, and are fastened in the second housing 20.

In some examples, when one second terminal pair 212 is fastened in each of some second terminal accommodating structures 2110 of the second support member 211, a plurality of second terminal pairs 212 may be respectively fastened in a plurality of consecutive second terminal accommodating structures 2110.

In some examples, when one second terminal pair 212 is fastened in each of some second terminal accommodating structures 2110 of the second support member 211, a plurality of second terminal pairs 212 may be alternately fastened in a plurality of second terminal accommodating structures 2110.

For example, a quantity of second terminal pairs 212 may be half of a quantity of second terminal accommodating structures 2110 included in the second support member 211. Therefore, one second terminal pair 212 may be fastened in one second terminal accommodating structure 2110 at intervals of one second terminal accommodating structure 2110.

According to the solution shown in this embodiment of the present disclosure, the Y/X serial connector 2 assembled by using the foregoing connector assembly method has a same outline dimension as a corresponding connector whose second terminal pair 212 is not removed. Therefore, a docking capability remains unchanged. In addition, because some second terminal accommodating structures 2110 in the Y/X serial connector 2 are vacant, costs of the Y/X serial connector 2 are relatively low.

In the frame device, a user may select a Y/X serial connector 2 of a corresponding specification based on an actual specification of a board (a line card board or a switch fabric unit), instead of selecting a connector of a same high specification, so that waste of terminal pairs and costs of the frame device are reduced.

The foregoing descriptions are merely optional embodiments of the present disclosure, but are not intended to limit the present disclosure. Any modification, equivalent replacement, or improvement made without departing from the principle of the present disclosure should fall within the protection scope of the present disclosure.

What is claimed is:

1. A connector, comprising:
a first housing having a vacancy;
at least one placeholder module; and
at least one first terminal module,
wherein the at least one first terminal module is configured to transmit an electrical signal, the at least one first terminal module is arranged in a thickness direction, and the at least one first terminal module is fastened in the first housing,
wherein the at least one placeholder module and the at least one first terminal module are arranged in the thickness direction,
wherein the at least one placeholder module is fastened in the first housing and is configured to occupy the vacancy in the first housing, and
wherein the at least one first terminal module is consecutively arranged, and the at least one placeholder module is consecutively arranged.

2. The connector according to claim 1, wherein the at least one placeholder module is a support member capable of supporting a terminal pair, the at least one placeholder module comprises at least one terminal accommodating structure, and the at least one terminal accommodating structure is vacant.

3. The connector according to claim 2, wherein the at least one first terminal module comprises a first support member and at least one first terminal pair, and the at least one first terminal pair is fastened on the first support member, and wherein the at least one placeholder module is same as the first support member.

4. The connector according to claim 2, wherein the at least one first terminal module comprises a first support member and at least one first terminal pair, the first support member comprises at least one first terminal accommodating structure, and the at least one first terminal pair is respectively fastened in the at least one first terminal accommodating structure, and wherein both the at least one terminal accommodating structure in the placeholder module and the at least one first terminal accommodating structure in the first support member are arranged in a first direction, and the at least one terminal accommodating structure and the at least one first terminal accommodating structure are alternated one after another in the first direction.

5. The connector according to claim 1, wherein the at least one placeholder module is a placeholder plate, and the at least one placeholder module has a plate structure.

6. The connector according to claim 1, wherein the at least one first terminal module and the at least one placeholder module have an equal thickness.

7. The connector according to claim 1, wherein a ratio of a quantity of first terminal modules to a quantity of placeholder modules is 1:1.

8. The connector according to claim 1, wherein the at least one first terminal module and the at least one placeholder module are alternately arranged.

9. A connector, comprising:
a second housing; and
a plurality of second terminal modules, wherein the plurality of second terminal modules are arranged in a thickness direction and are fastened in the second housing, wherein each second terminal module comprises a second support member and at least one second terminal pair, wherein the second support member comprises a plurality of second terminal accommodating structures, each second terminal pair is fastened in one second terminal accommodating structure, and at least one second terminal accommodating structure is vacant, and wherein the second terminal accommodating structures that are in the second support member and in which the second terminal pair is fastened and the vacant second terminal accommodating structures in the second support member are alternately arranged.

10. The connector according to claim 9, wherein a ratio of a quantity of second terminal accommodating structures that are in the second support member and in which the second terminal pair is fastened to a quantity of vacant second terminal accommodating structures in the second support member is 1:1.

11. The connector according to claim 9, wherein the second terminal accommodating structures that are in the second support member and in which the second terminal pair is fastened are consecutively arranged, and the vacant second terminal accommodating structures in the second support member are consecutively arranged.

12. The connector according to claim 9, wherein the plurality of second terminal accommodating structures that are in the second support member and in which the second terminal pair is fastened are arranged in a same manner as the vacant second terminal accommodating structures in the second support member.

13. A frame device, comprising:
a first board;
a second board;
a first connector; and
a second connector,
wherein at least one of the first connector or the second connector comprises a first housing, at least one placeholder module, and at least one first terminal module, wherein the at least one first terminal module is configured to transmit an electrical signal, the at least one first terminal module is arranged in a thickness direction, the at least one first terminal module is fastened in the first housing, and the first housing has a vacancy, wherein the at least one placeholder module and the at least one first terminal module are arranged in the thickness direction, wherein the at least one placeholder module is fastened in the first housing and is configured to occupy the vacancy in the first housing, wherein the at least one first terminal module is consecutively arranged, and the at least one placeholder module is consecutively arranged, wherein the first board is electrically coupled to a first end of the first connector, wherein the second board is electrically coupled to a first end of the second connector, and wherein a second end of the first connector is electrically coupled to a second end of the second connector.

14. The frame device according to claim 13, wherein the first board is a switch fabric unit, and the second board is a line card board.

15. The frame device according to claim 14, wherein a position of a vacant second terminal accommodating structure of the second connector corresponds to a position of a vacancy of the first connector; or a position of a vacancy of the second connector corresponds to a position of a vacant second terminal accommodating structure of the first connector.

16. A connector assembly method implemented by a connector, comprising:

arranging at least one first terminal module and at least one placeholder module in a thickness direction; and fastening the at least one first terminal module and the at least one placeholder module in a first housing, wherein the first terminal module is configured to transmit an electrical signal, and wherein the first housing in which the at least one first terminal module is fastened has a vacancy, wherein the at least one placeholder module and the at least one first terminal module are arranged in the thickness direction, wherein the at least one placeholder module is fastened in the first housing and is configured to occupy the vacancy in the first housing, and wherein the at least one first terminal module is consecutively arranged, and the at least one placeholder module is consecutively arranged.

* * * * *